(12) United States Patent
Hayashi et al.

(10) Patent No.: US 7,869,299 B2
(45) Date of Patent: Jan. 11, 2011

(54) INTERNAL-VOLTAGE GENERATING CIRCUIT AND SEMICONDUCTOR DEVICE INCLUDING THE SAME

(75) Inventors: Koichiro Hayashi, Tokyo (JP); Hitoshi Tanaka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 123 days.

(21) Appl. No.: 12/259,846

(22) Filed: Oct. 28, 2008

(65) Prior Publication Data

US 2009/0116329 A1 May 7, 2009

(30) Foreign Application Priority Data

Oct. 29, 2007 (JP) ............................. 2007-280505

(51) Int. Cl.
*G11C 7/00* (2006.01)
(52) U.S. Cl. ............. 365/226; 365/189.09; 365/230.06; 365/189.11
(58) Field of Classification Search ................ 365/226, 365/189.09, 230.06, 189.11, 230.03; 327/536–538
See application file for complete search history.

(56) References Cited

U.S. PATENT DOCUMENTS 7,142,045 B2 * 11/2006 Mo et al. .................... 327/535
7,646,652 B2 * 1/2010 Byeon ................... 365/189.09

FOREIGN PATENT DOCUMENTS

| JP | 2005-038502 A | 2/2005 |
| JP | 2005-071556 A | 3/2005 |
| JP | 2006-180255 A | 7/2006 |

* cited by examiner

*Primary Examiner*—David Lam
(74) *Attorney, Agent, or Firm*—Sughrue Mion, PLLC

(57) ABSTRACT

An internal-voltage generating circuit includes a plurality of generating units connected in cascade, out of the plurality of generating units, a generating unit of relatively lower level is activated by an output of a generating unit of relatively higher level. According to the present invention, because the plural voltage generating units are connected in cascade, the voltage generating unit of lower level is not activated unless the voltage generating unit of higher level is activated. Therefore, at least the voltage generating unit of the second level and the subsequent voltage generating units consume very small power during the standby time. Consequently, total power consumption of the internal-voltage generating circuit can be reduced.

19 Claims, 20 Drawing Sheets

INTERNAL-VOLTAGE GENERATING CIRCUIT AND SEMICONDUCTOR DEVICE INCLUDING THE SAME

BACKGROUND OF THE INVENTION

1. Field of the Invention

The present invention relates to an internal-voltage generating circuit and a semiconductor device including the same, and, more particularly relates to an internal-voltage generating circuit generating inside a chip thereof an internal voltage different from a power supply voltage supplied from outside, and a semiconductor device including the internal-voltage generating circuit.

2. Description of Related Art

A power supply voltage used in a semiconductor device such as a DRAM (Dynamic Random Access Memory) and the like has been reduced year by year, and power consumption has been also reduced accordingly. While a power supply voltage has been generally 5 V in the past, it has been reduced thereafter to 3.3 V, and a voltage of about 1.2 V is often used at present.

However, depending on a kind of a semiconductor device, there are internal circuits requiring a higher voltage than the power supply voltage. For example, in a DRAM, a selected word line is often set to a higher voltage than the power supply voltage. In this case, a boosted internal voltage is necessary in a word-line driving circuit. An internal-voltage generating circuit provided in the semiconductor device generates this internal voltage.

FIG. 16 is a block circuit showing one example of a semiconductor device including an internal-voltage generating circuit according to a related art.

A semiconductor device 10 shown in FIG. 16 includes an internal-voltage generating circuit 11 generating an internal voltage VPP by boosting a power supply voltage VDD, and an internal circuit 12 operated at the internal voltage VPP. With this arrangement, even when the power supply voltage VDD is set low, a higher internal voltage VPP can be supplied to the internal circuit 12.

However, in the semiconductor device 10 shown in FIG. 16, the internal-voltage generating circuit 11 continues generating the internal voltage VPP, regardless of whether the internal circuit 12 is in an active state. That is, even when the internal circuit 12 is in a standby state, the internal-voltage generating circuit 11 consumes power. Therefore, the semiconductor device 10 has a problem of consuming large power.

FIG. 17 is a block circuit showing another example of a semiconductor device including an internal-voltage generating circuit according to a related art.

A semiconductor device 20 shown in FIG. 17 has a P-channel MOS transistor 23 connected between a power source wiring supplied with the power supply voltage VDD and an internal-voltage generating circuit 21. A control signal 23a is supplied to a gate of the transistor 23. The control signal 23a becomes at a low level when the internal circuit 22 is in the active state, and becomes at a high level when the internal circuit 22 is in the standby state. Based on this configuration, a power supply to the internal-voltage generating circuit 21 is suspended during a period while the internal circuit 22 is in the standby state. Therefore, power consumption can be reduced more than that in the semiconductor device 10 shown in FIG. 16.

However, even when the transistor 23 is turned off, a predetermined off current $I_{OFF}$ flows. The off current $I_{OFF}$ greatly depends on a threshold voltage of the transistor 23. When the threshold voltage becomes higher, the off current $I_{OFF}$ becomes smaller, and when the threshold voltage becomes lower, the off current $I_{OFF}$ becomes larger. Therefore, when the power supply voltage VDD is high to some extent, the threshold voltage of the transistor 23 can be set high accordingly. Consequently, power consumption due to the off current $I_{OFF}$ does not become so problematic.

However, as described above, because the power supply voltage VDD has become lower in recent years, it is essential to use the transistor 23 having a lower threshold voltage. When the power supply voltage VDD becomes lower, the power consumption due to the off current $I_{OFF}$ increases, and the power reduction effect using the transistor 23 becomes small. Particularly, in the field where lower power consumption is important like products for mobile devices, power consumption due to the off current $I_{OFF}$ becomes a nonnegligible level.

Apart from the above, Japanese Patent Application Laid-open Nos. 2005-38502, 2005-71556, and 2006-180255 describe other techniques of reducing power consumption in a standby state.

SUMMARY

The present invention seeks to solve one or more of the above problems, or to improve upon those problems at least in part.

In one embodiment, there is provided an internal-voltage generating circuit that includes . . . .

According to the present invention, because the plural voltage generating units are connected in cascade, the lower voltage generating unit is not activated unless the higher voltage generating unit is activated. Therefore, at least the voltage generating unit of the second level and the subsequent voltage generating units consume very small power during the standby time. Consequently, total power consumption of the internal-voltage generating circuit can be reduced.

In the present invention, it is preferable that each of plural voltage generating units includes a first voltage generating unit generating a first internal voltage, and a second voltage generating unit activated by the first internal voltage and generating a second internal voltage, that the second voltage generating unit is activated by conducting a first transistor provided between a power source wiring supplied with one potential of a power supply voltage and the second voltage generating unit, and that a threshold voltage of the first transistor exceeds the power supply voltage. With this arrangement, the off current $I_{OFF}$ of the first transistor becomes substantially smaller than a current according to a related art. Therefore, power consumption of a second power source circuit unit during a standby time can be substantially reduced.

When the first transistor is connected to a higher potential of the power supply voltage, the N-channel MOS transistor can be used as the first transistor. Conversely, when the first transistor is connected to a lower potential of the power supply voltage, the P-channel MOS transistor can be used as the first transistor. With this arrangement, the threshold voltage of the first transistor can be set to exceed the power supply voltage.

In the present invention, it is preferable that the first voltage generating unit is activated by conducting a second transistor provided between the power source wiring and the first voltage generating unit, and that the threshold voltage of the second transistor is equal to or lower than the power supply voltage. With this arrangement, the off current $I_{OFF}$ of the second transistor can be also decreased. Therefore, total power consumption of the internal-voltage generating circuit can be further reduced.

When the second transistor is connected to the higher potential of the power supply voltage, the P-channel MOS transistor can be used as the second transistor. Conversely, when the second transistor is connected to the lower potential of the power supply voltage, the N-channel MOS transistor can be used as the second transistor. With this arrangement, the threshold voltage of the second transistor can be set equal to or lower than the power supply voltage. Therefore, control can be performed without using the internal voltage.

Further, the semiconductor device according to the present invention includes the above described internal-voltage generating circuit, a first internal circuit operated at the power supply voltage, and a second internal circuit operated at the internal voltage. According to the present invention, power consumption when at least the second internal circuit is in the standby state can be reduced.

As explained above, the present invention can reduce power consumption of an internal-voltage generating circuit during a standby time.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
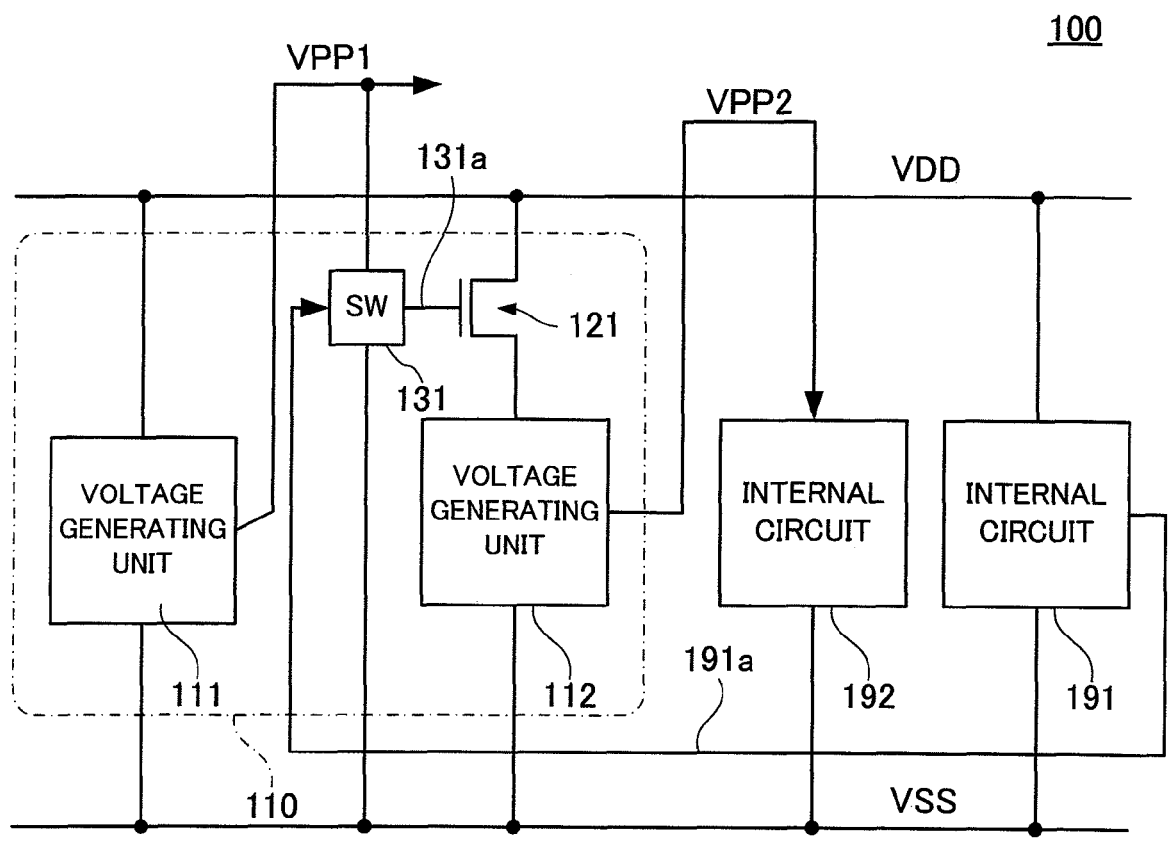
FIG. 1 is a block diagram showing a semiconductor device 100 according to a first embodiment of the present invention.

FIG. 1 is a block diagram showing a semiconductor device 100 according to a first embodiment of the present invention.

The semiconductor device 100 shown in FIG. 1 is operated at the power supply voltage VDD supplied from outside, and includes an internal-voltage generating circuit 110 generating internal voltages VPP1 and VPP2, an internal circuit 191 operated at the power supply voltage VDD, and an internal circuit 192 operated at the internal voltage VPP2. Although not shown, the semiconductor device 100 can also include other internal circuit operated at the internal voltage VPP1. The type of the semiconductor device 100 is not particularly limited, and can be a memory semiconductor device such as a DRAM and a flash memory, or can be a processor semiconductor device such as a CPU and a DSP.

The internal voltages VPP1 and VPP2 generated by the internal-voltage generating circuit 110 are higher than the power supply voltage VDD. The power supply voltage and the internal voltages are defined by a potential difference between the higher potential and the lower potential, respectively, and the lower potential is a ground potential. Therefore, in the first embodiment, the higher potentials of the internal voltages VPP1 and VPP2 are higher than the higher potential of the power supply voltage VDD.

The internal circuit 191 operated at the power supply voltage VDD is a circuit block that can be operated at a relatively low voltage. On the other hand, the internal circuit 192 operated at the internal voltage VPP2 is a circuit block that needs to be operated at a relatively high voltage. As one example, when the semiconductor device 100 according to the first embodiment is a DRAM, various control circuits such as an address counter and a command decoder correspond to the internal circuit 191, and a word-line driving circuit activating word lines corresponds to the internal circuit 192.

The internal circuit 191 generates a standby signal 191a. The standby signal 191a becomes at a standby level when at least the internal circuit 192 becomes in the standby state. The standby signal 191a becomes at an active level when at least the internal circuit 192 becomes in the active state. The standby signal 191a is supplied to the internal-voltage generating circuit 110.

As shown in FIG. 1, the internal-voltage generating circuit 110 has two voltage generating units 111 and 112 connected in cascade. The voltage generating units 111 and 112 are circuit blocks operated at the power supply voltage VDD. The voltage generating unit 111 located at a relatively higher position generates the internal voltage VPP1, and the voltage generating unit 112 located at a relatively lower position generates the internal voltage VPP2.

Figure 2A:
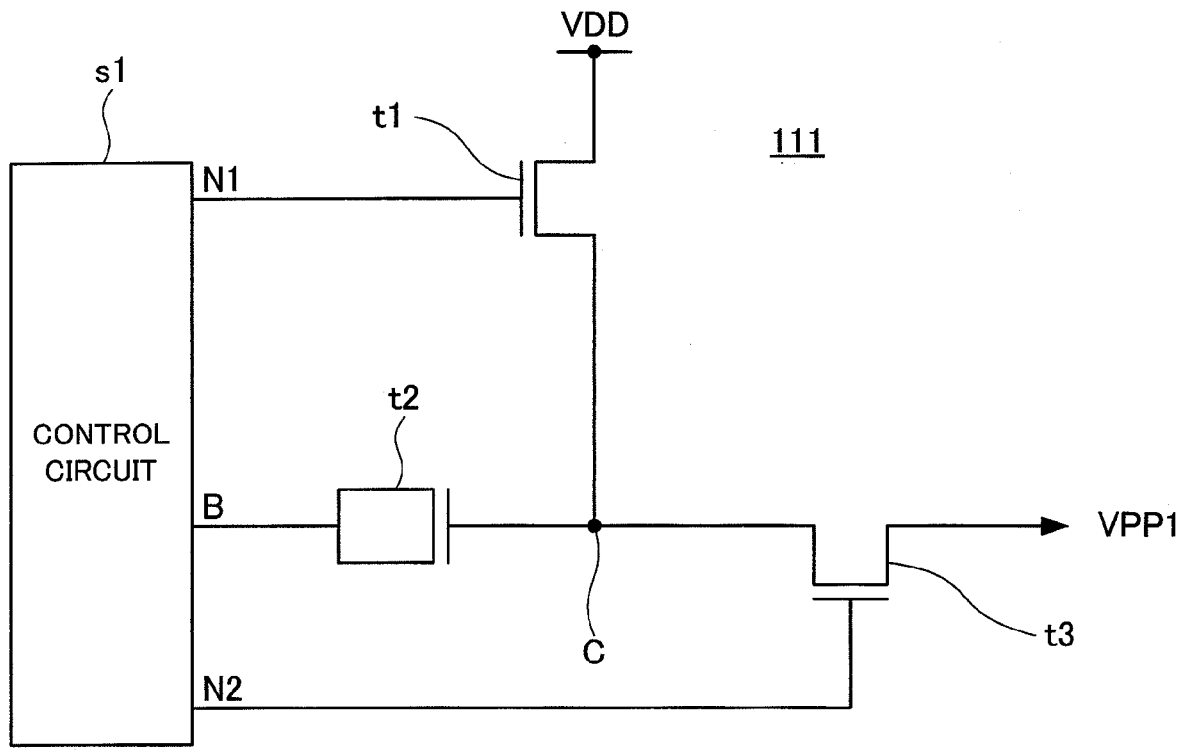
FIG. 2A shows one example of a detailed circuit configuration of the voltage generating unit according to the first embodiment of the present invention.
Figure 2B:
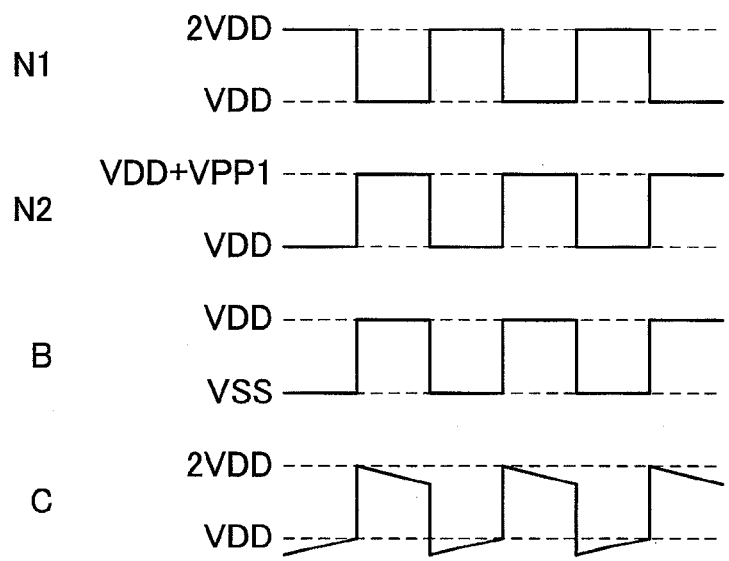
FIG. 2B is an operation waveform diagram of the voltage generating unit.

FIG. 2A shows one example of a detailed circuit configuration of the voltage generating unit 111, and FIG. 2B is an operation waveform diagram of the voltage generating unit 111.

The voltage generating unit 111 shown in FIG. 2A generates the internal voltage VPP1 which is two times of the power supply voltage VDD, and is configured by N-channel MOS transistors t1 to t3, and a control circuit s1 controlling the operation of these transistors.

The transistor t1 is connected between a power source wiring to which the power supply voltage VDD is supplied and a node C. The control circuit s1 supplies a control voltage N1 to a gate of the transistor t1. A source and a drain of the transistor t2 are short-circuited, and therefore the transistor t2 functions as a capacitor. A gate of the transistor t2 is connected to the node C. The control circuit s1 supplies a control voltage B to the source/drain of the transistor t2. The transistor t3 is connected between the node C and an output terminal. The control circuit s1 supplies a control voltage N2 to a gate of the transistor t3. A threshold voltage of the transistor t1 is set to an intermediate voltage between 2VDD and VDD. A threshold voltage of the transistor t3 is set to an intermediate voltage between VDD+VPP1 and VDD.

The voltage generating unit 111 having this configuration generates the internal voltage VPP1 as an output, by alternately repeating a charge operation and a pumping operation as shown in FIG. 2B.

The charge operation is performed by setting the control voltages N1, B, and N2 to 2VDD, VSS, and VDD, respectively. As a result, the transistor t1 is turned on, and the transistor t3 is turned off. Accordingly, a charging of the transistor t2 is started, and a voltage of the node C is charged to VDD as shown in FIG. 2B.

The pumping operation is performed by setting the control voltages N1, B, and N2 to VDD, VDD, and VDD+VPP1, respectively. As a result, the transistor t1 is turned off, and the transistor t3 is turned on. Accordingly, a total voltage 2VDD of the charge voltage of the transistor t2 and the voltage B is output to an output terminal of the voltage generating unit 111.

By alternately repeating this operation, the internal voltage VPP1 as the output of the voltage generating unit 111 is boosted to two times of the power supply voltage VDD.

Figure 3A:
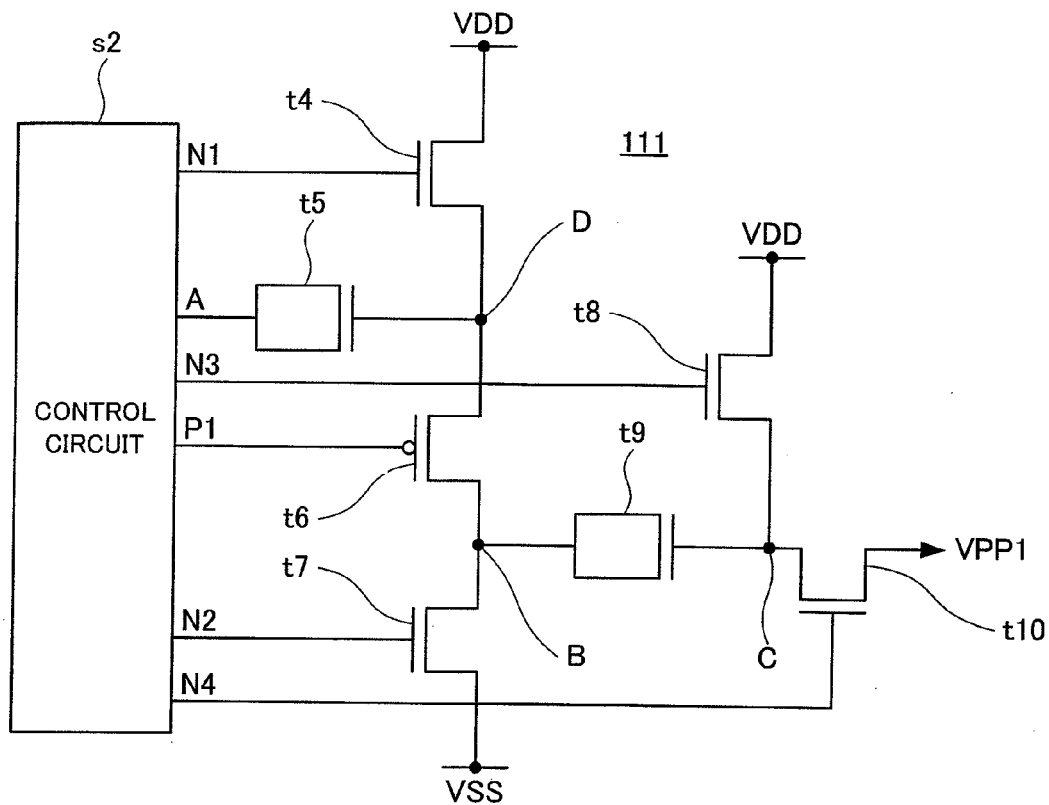
FIG. 3A shows other example of a detailed circuit configuration of the voltage generating unit according to the first embodiment of the present invention.
Figure 3B:
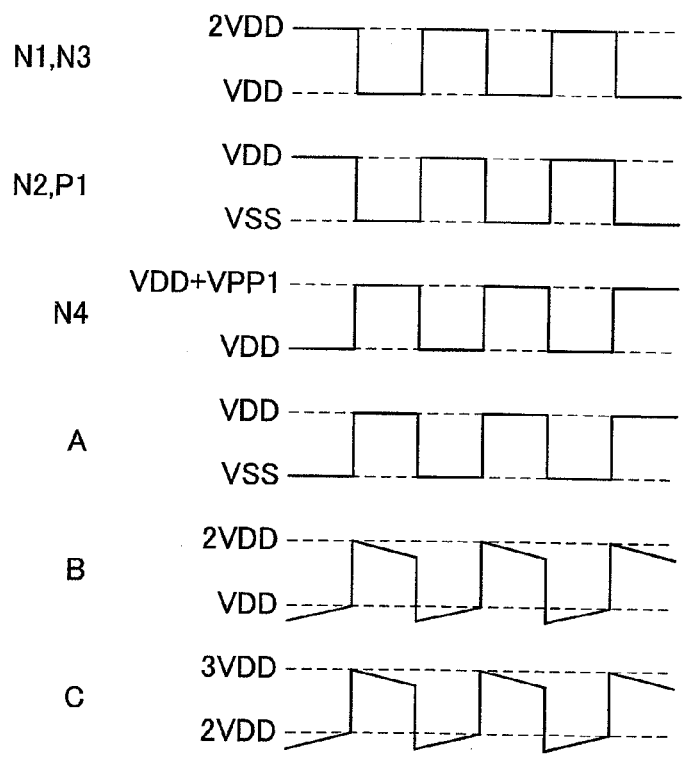
FIG. 3B is an operation waveform diagram of the voltage generating unit.

FIG. 3A shows other example of a detailed circuit configuration of the voltage generating unit 111, and FIG. 3B is an operation waveform diagram of the voltage generating unit 111.

The voltage generating unit 111 shown as an example in FIG. 3A is a circuit generating the internal voltage VPP1 which is three times of the power supply voltage VDD, and includes N-channel MOS transistors t4, t5, and t7 to t10, a P-channel MOS transistor t6, and a control circuit s2 controlling the operation of these transistors.

The transistors t4, t6, and t7 are connected in series between VDD and VSS. The control circuit s2 supplies control voltages N1, P1, and N2 to the gates of these transistors, respectively. The transistor t5 has a source and a drain short-circuited, and functions as a capacitor. A gate of the transistor t5 is connected to a node D. The control circuit s2 supplies a control voltage A to the source/drain of the transistor t5. The transistors t8 to t10 correspond to the transistors t1 to t3 shown in FIG. 2A.

The control circuit s2 controls the voltages N1, N2, N3, N4, P1, A, B, and C in a similar manner to that of the control circuit s1 explained with reference to FIGS. 2A and 2B. The control circuit s2 causes VPP1=3VDD to be output to the output terminal of the voltage generating unit 111.

The circuits shown in FIGS. 2A, 2B, 3A and 3B show only one example of the voltage generating unit 111, respectively, and can have a circuit configuration different from the configurations of these circuits. It suffices that the voltage generating unit 112 generating the internal voltage VPP2 also have a circuit configuration similar to those shown in FIGS. 2A, 2B, 3A and 3B.

Referring back to FIG. 1, the power supply voltage VDD is directly supplied to the voltage generating unit 111 located at the higher position. In contrast, the power supply voltage VDD is not directly supplied to the voltage generating unit 112 located at the lower position, but is supplied to the voltage generating unit 112 via an N-channel MOS transistor 121. That is, the transistor 121 is connected between the power source wiring to which the higher potential of the power supply voltage VDD is supplied and the voltage generating unit 112. When the transistor 121 is turned on, the power supply voltage VDD is supplied to the voltage generating unit 122 to activate the voltage generating unit 112. As a result, the voltage generating unit 112 generates the internal voltage VPP2. On the other hand, when the transistor 121 is turned off, the power supply voltage VDD is not supplied to the voltage generating unit 112. Accordingly, the voltage generating unit 112 becomes in the inactive state, and stops generating the internal voltage VPP2.

A control signal 131a as an output of a switch 131 is supplied to a gate of the transistor 121. The switch 131 is operated at the internal voltage VPP1 generated by the voltage generating unit 111. When the standby signal 191a is at the active level, the switch 131 sets the control signal 131a to the VPP1 level. When the standby signal 191a is at the standby level, the switch 131 sets the control signal 131a to the ground level. Accordingly, a gate voltage of the transistor 121 changes between the ground level and the VPP1 level.

As explained above, the voltage generating unit 112 is controlled by the switch 131 operated at the internal voltage VPP1. Therefore, the voltage generating unit 112 located at the lower position is not activated when the voltage generating unit 111 located at the higher position does not generate the internal voltage VPP1. Accordingly, the voltage generating unit 112 is activated by the output of the voltage generating unit 111.

As described above, the internal voltage VPP1 is a higher voltage than the power supply voltage VDD. Therefore, a threshold voltage of the N-channel transistor 121 can be set to exceed the power supply voltage VDD. This means that while the transistor 121 is off, the off current $I_{OFF}$ becomes very small. That is, when the internal circuit 192 becomes in the standby state and also when the internal voltage VPP2 does not need to be supplied, power consumption of the voltage generating unit 112 becomes substantially zero. As a result, wasteful power consumption can be reduced.

On the other hand, the voltage generating unit 111 is always operated regardless of the standby signal 191a. However, the driving capability of the voltage generating unit 111 is sufficient with a capability capable of operating at least the switch 131. That is, the driving capability of the voltage generating unit 111 can be set sufficiently smaller than the driving capability of the voltage generating unit 112, and power consumption generated by the voltage generating unit 111 is small.

As explained above, according to the first embodiment, power consumption of the voltage generating unit 112 during the standby time becomes substantially zero. Therefore, wasteful power consumption generated by the internal voltage generating circuit 110 can be reduced.

A second embodiment of the present invention is explained next.

Figure 4:
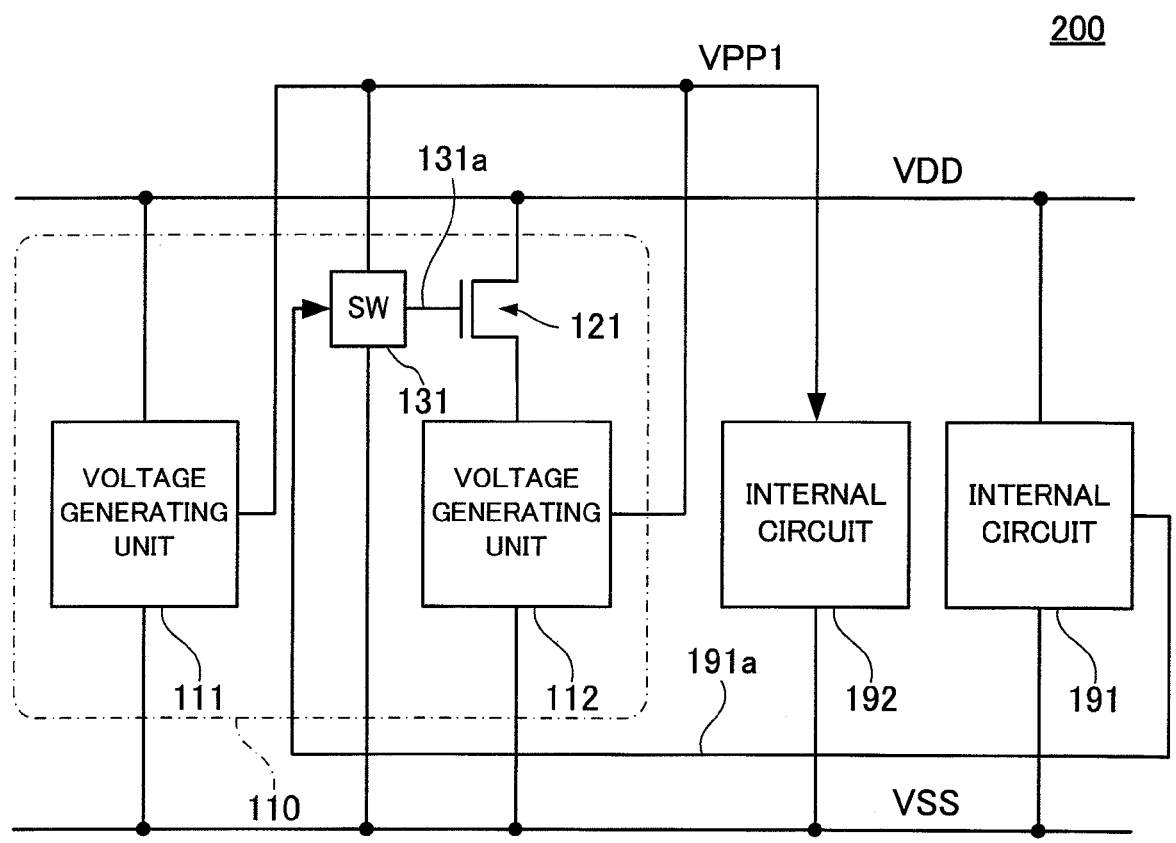
FIG. 4 is a block diagram showing a semiconductor device according to a second embodiment of the present invention.

FIG. 4 is a block diagram showing a semiconductor device 200 according to the second embodiment.

As shown in FIG. 4, in the semiconductor device 200, both the voltage generating unit 111 and the voltage generating unit 112 generate the internal voltage VPP1. The output of the voltage generating unit 111 and the output of the voltage generating unit 112 are short-circuited, and the internal circuit 192 is operated at the internal voltage VPP1. Other configurations of the semiconductor device 200 are similar to those of the semiconductor device 100, and therefore identical elements are denoted by like reference numerals and redundant explanations thereof will be omitted.

In the second embodiment, power consumption of the voltage generating unit 112 during the standby time also becomes substantially zero. Therefore, wasteful power consumption generated by the internal voltage generating circuit 110 can be reduced. Further, in the second embodiment, even when the operation of the voltage generating unit 112 stops, the internal voltage VPP1 is supplied to the internal circuit 192 from the voltage generating unit 111. Therefore, logic of the internal circuit 192 in the standby state can be correctly fixed.

A third embodiment of the present invention is explained next.

Figure 5:
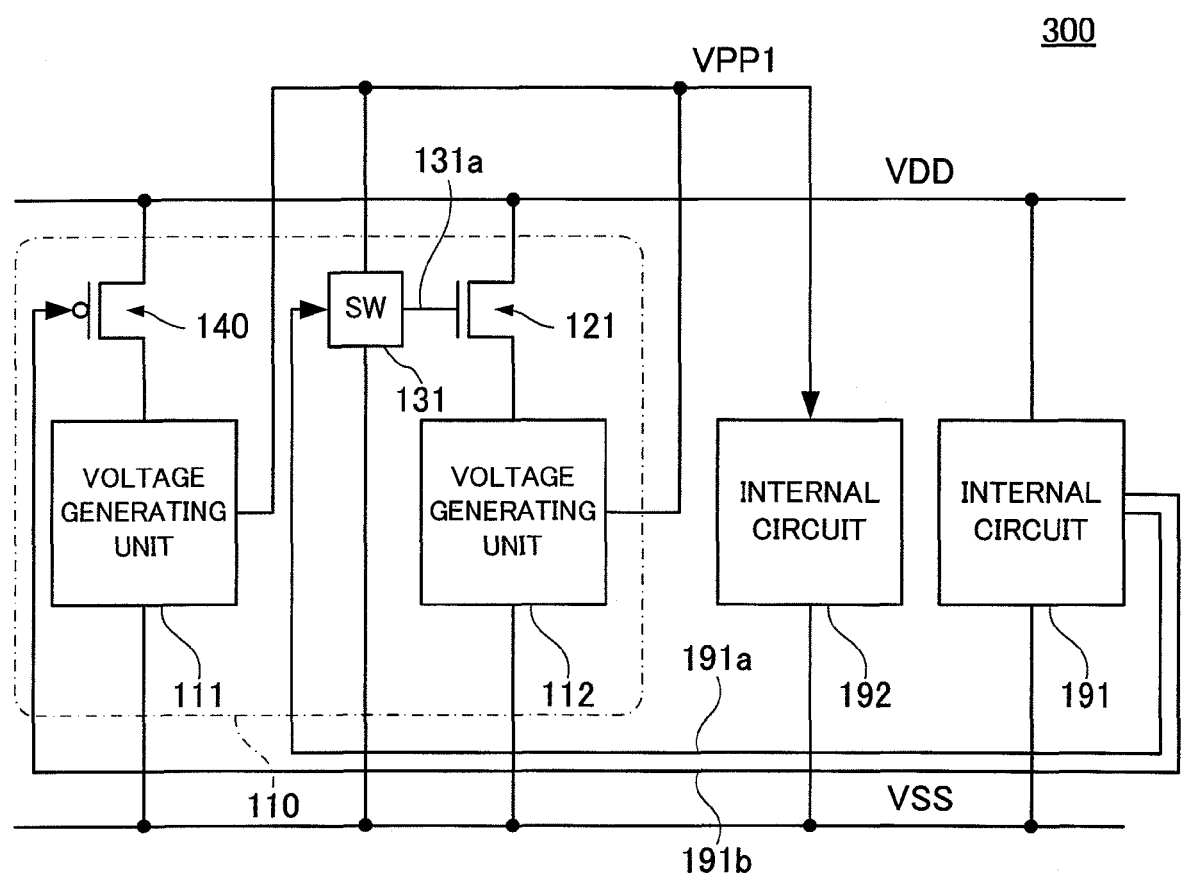
FIG. 5 is a block diagram showing a semiconductor device according to a third embodiment of the present invention.

FIG. 5 is a block diagram showing a semiconductor device 300 according to the third embodiment.

As shown in FIG. 5, the semiconductor device 300 includes a P-channel MOS transistor 140 between the power source wiring to which the higher potential of the power supply voltage VDD is supplied and the voltage generating unit 111. Other configurations of the semiconductor device 300 are similar to those of the semiconductor device 200 shown in FIG. 4, and therefore identical elements are denoted by like reference numerals and redundant explanations thereof will be omitted.

In the third embodiment, the internal circuit 191 generates a power down signal 191b in addition to the standby signal 191a. The power down signal 191b becomes at the ground level when the internal circuit 192 becomes in the active state or a temporary standby state. The power down signal 191b becomes at the VDD level when the internal circuit 192 enters a low power consumption mode such as a power down mode. The power down signal 191b is supplied to the internal-voltage generating circuit 110.

The power supply voltage VDD is supplied to the voltage generating unit 111 via the transistor 140. That is, when the transistor 140 is turned on, the power supply voltage VDD is supplied to the voltage generating unit 111 to activate the voltage generating unit 111. As a result, the voltage generating unit 111 generates the internal voltage VPP1. On the other hand, when the transistor 140 is turned off, the power supply voltage VDD is not supplied to the voltage generating unit 111. Accordingly, the voltage generating unit 111 becomes in the inactive state, and stops generating the internal voltage VPP1.

The power down signal 191b is supplied to the gate of the transistor 140 from the internal circuit 191. As a result, the gate voltage of the transistor 140 changes between the ground level and the VDD level.

Based on this configuration, when the internal circuit 192 is in the active state, both voltage generating units 111 and 112 become in the active state. When the internal circuit 192 is in the standby state, only the voltage generating unit 111 becomes in the active state. When the internal circuit 192 is in the power down state, both voltage generating units 111 and 112 become in the inactive state. As a result, according to the third embodiment, in addition to the effect of the semiconductor device 200 explained with reference to FIG. 4, power consumption during the power down mode can be reduced.

A fourth embodiment of the present invention is explained next.

Figure 6:
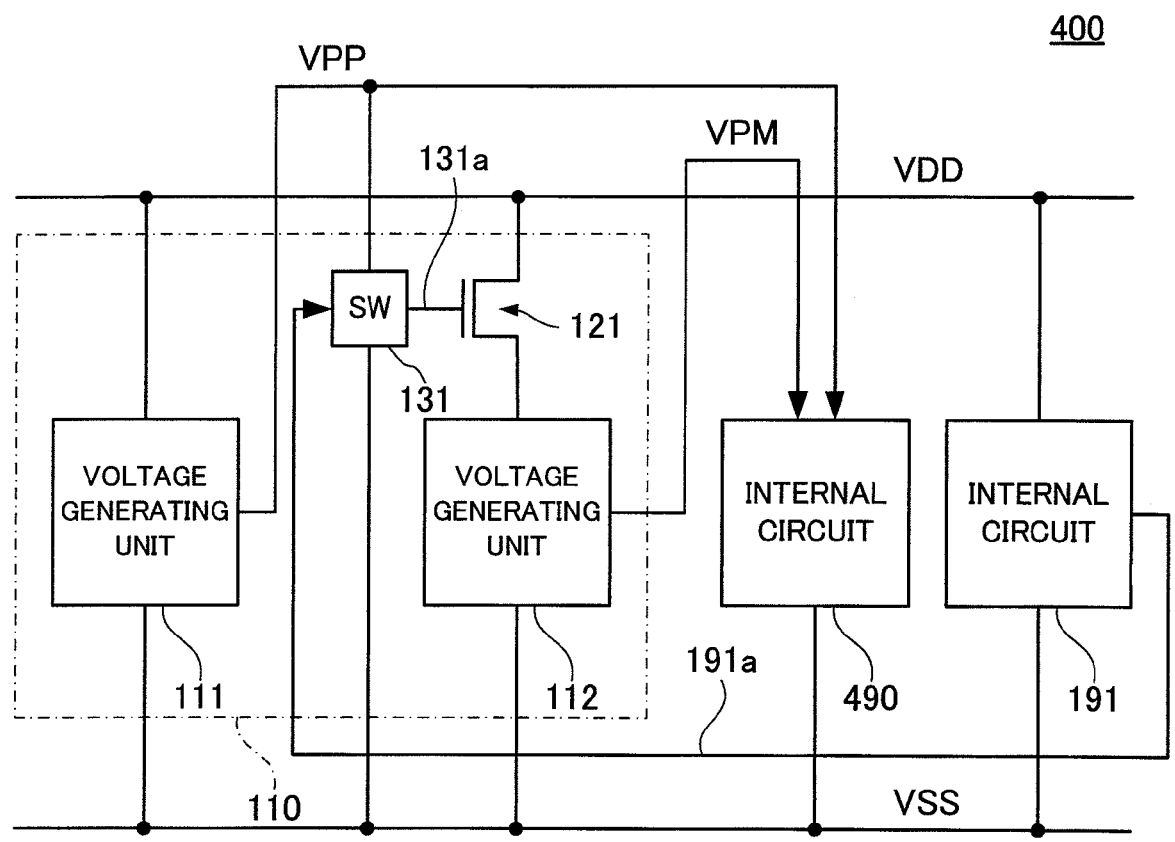
FIG. 6 is a block diagram showing a semiconductor device according to a fourth embodiment of the present invention.

FIG. 6 is a block diagram showing a semiconductor device 400 according to the fourth embodiment.

As shown in FIG. 6, in the semiconductor device 400, the voltage generating unit 111 generates the internal voltage VPP, and the voltage generating unit 112 generates an internal voltage VPM. These internal voltages VPP and VPM are supplied to an internal circuit 490. The internal voltage VPM is higher than the power supply voltage VDD and is lower than the internal voltage VPP. Other configurations of the semiconductor device 400 are similar to those of the semiconductor device 100 shown in FIG. 1, and therefore identical elements are denoted by like reference numerals and redundant explanations thereof will be omitted.

Figure 7:
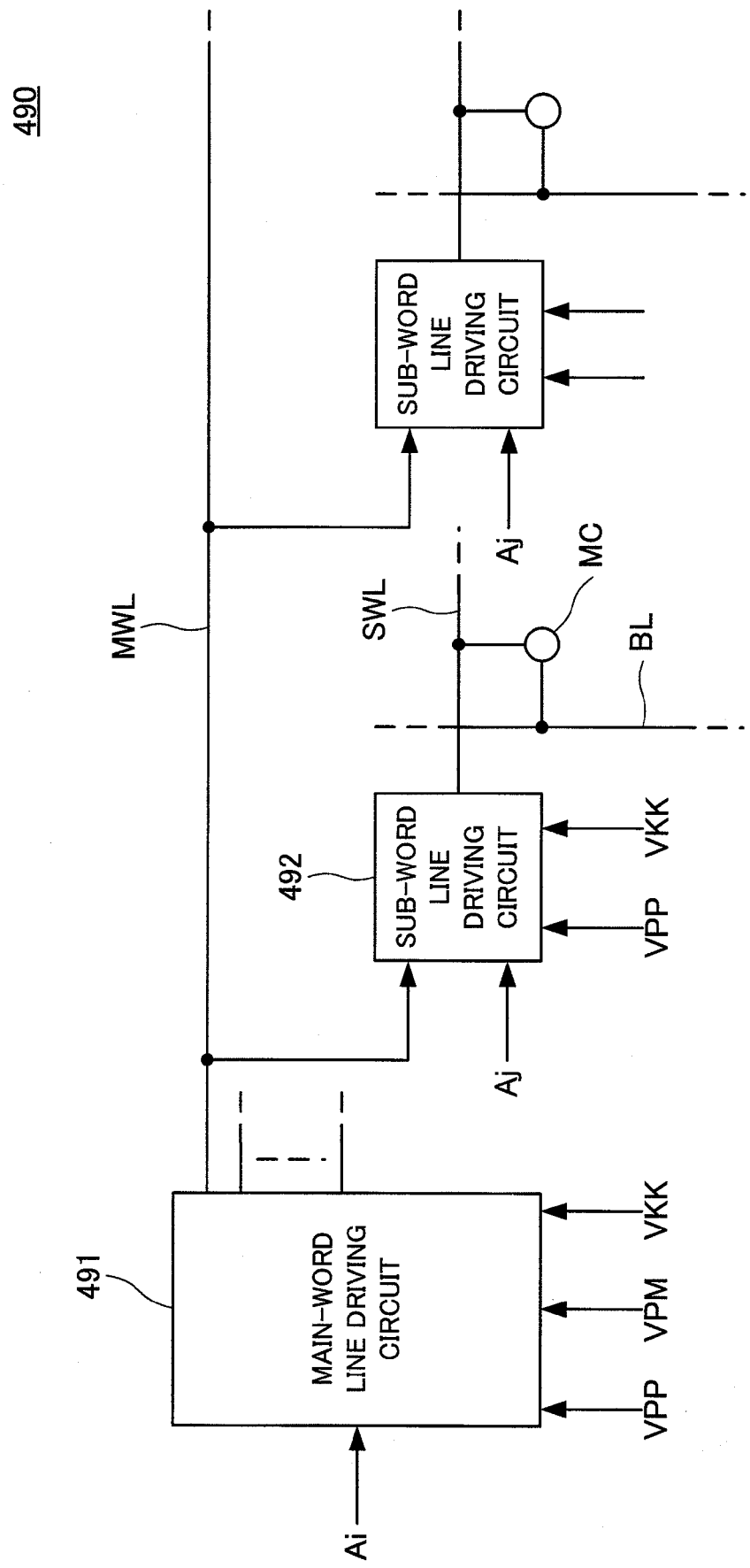
FIG. 7 is a circuit diagram showing a configuration of main parts of the internal circuit according to the fourth embodiment of the present invention.

FIG. 7 is a circuit diagram showing a configuration of main parts of the internal circuit 490.

As shown in FIG. 7, the internal circuit 490 includes a main-word line driving circuit 491 and a sub-word line driving circuit 492. The main-word line driving circuit 491 activates main-word lines MWLs based on a part Ai of a predecoded row address. The sub-word line driving circuit 492 activates sub-word lines SWLs based on the other part Aj of the predecoded row address. In this way, in the internal circuit 490, word lines are hierarchised into the main-word line MWLs and the sub-word line SWLs. Memory cells MCs are arranged at intersections between the sub-word lines SWLs and bit line BLs. When the sub-word line SWL is activated, a corresponding memory cell MC and the bit line BL are connected to each other.

Internal voltages VPP, VPM, and VKK are supplied as operating voltages to the main-word line driving circuit 491. The internal voltage VKK is a minus voltage lower than VSS. On the other hand, the internal voltages VPP and VKK are supplied as operating voltages to the sub-word line driving circuit 492.

The main-word line driving circuit 491 gives the internal voltage VKK to a selected main-word line MWL, and gives the internal voltage VPP to an unselected main-word line MWL. On the contrary, the sub-word line driving circuit 492 gives the internal voltage VPP to a selected sub-word line SWL, and gives the internal voltage VKK to an unselected sub-word line SWL.

When the internal circuit 490 becomes in the standby state, the main-word line driving circuit 491 gives the internal voltage VPM to all main-word lines MWLs, thereby reducing power consumption of the internal circuit 490. As described above, the internal voltage VPM is lower than the internal voltage VPP. This relationship (VPM<VPP) is preferably secured even during a period when the voltage is not stable at the time of turning on the power source, for example. This is because when the relationship is temporarily reversed to VPM>VPP at the time of turning on the power source, for example, a through current flows. This problem is explained in further detail.

Figure 18:
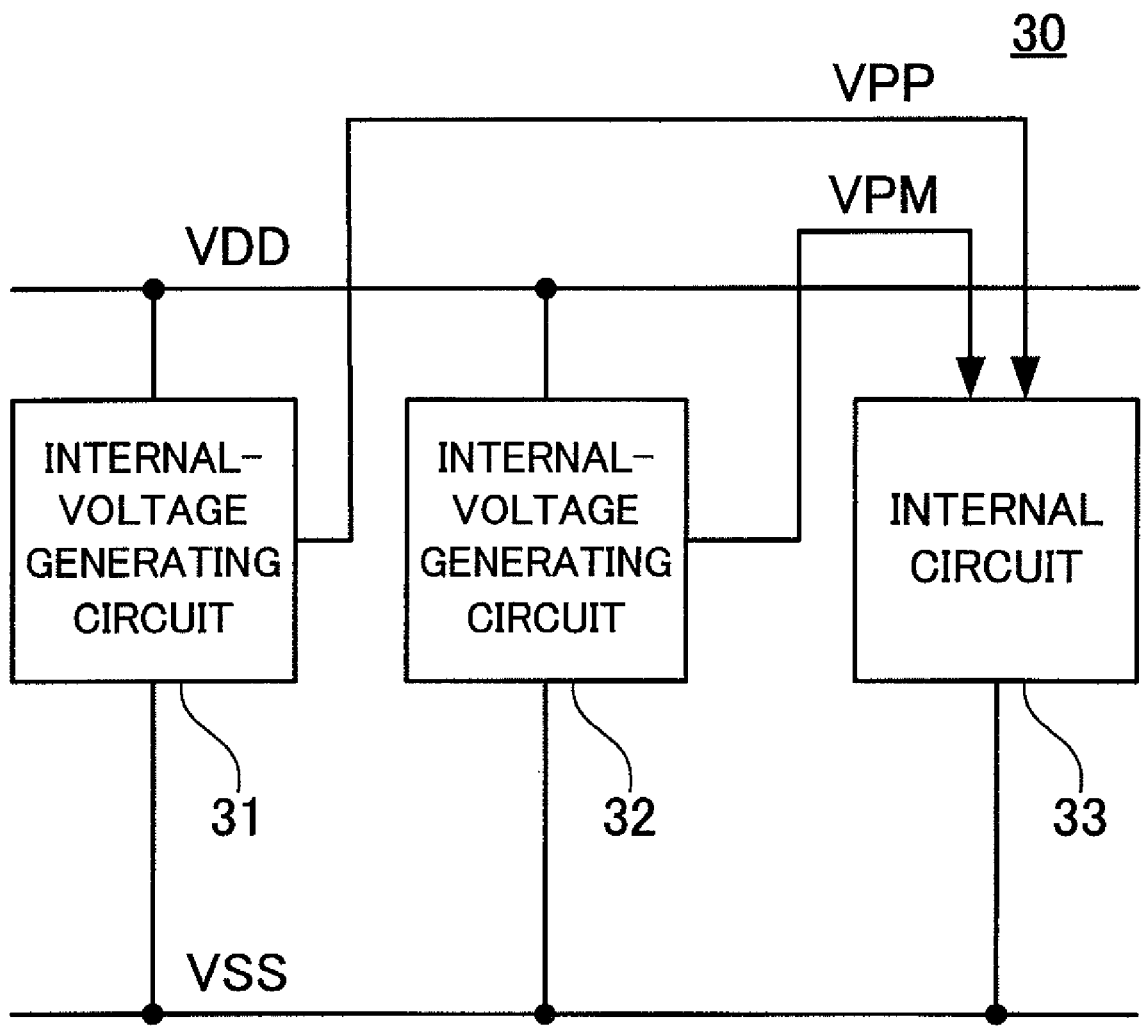
FIG. 18 is a block circuit showing a semiconductor device according to a related art of the present invention.

FIG. 18 is a block diagram showing a semiconductor device 30 according to a related art of the present invention. The semiconductor device 30 includes internal-voltage generating circuits 31 and 32, and an internal circuit 33. The internal-voltage generating circuit 31 generates the internal voltage VPP, and the internal-voltage generating circuit 32 generates the internal voltage VPM.

Figure 19:
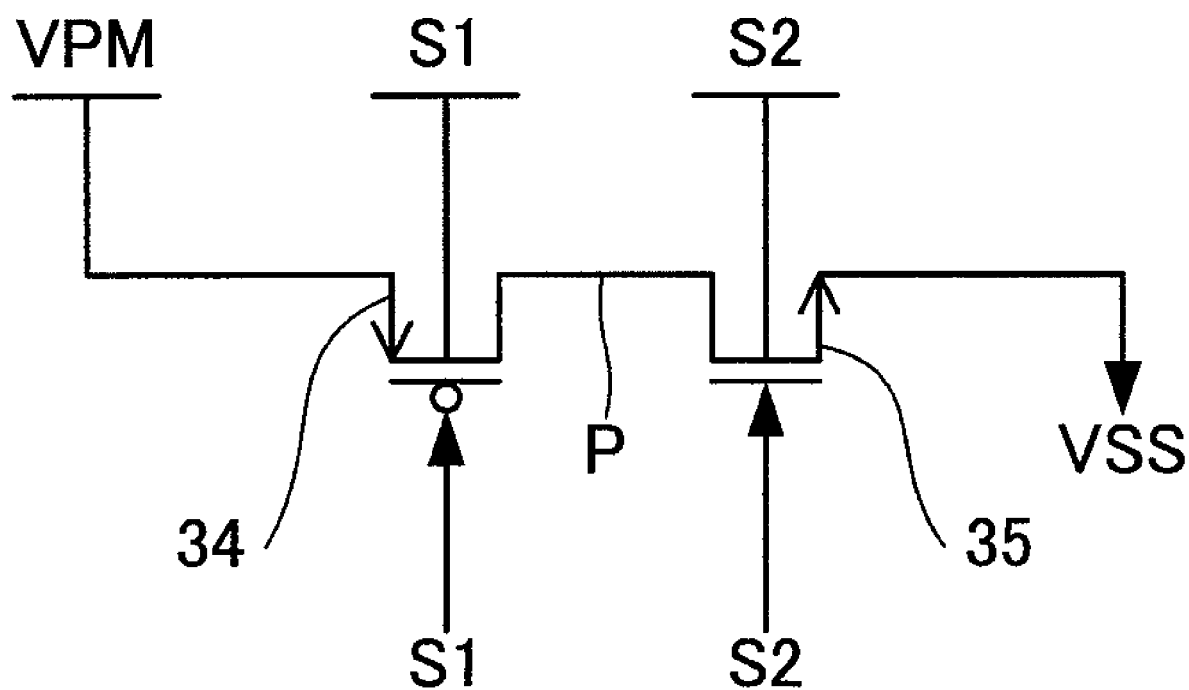
FIG. 19 is a diagram showing a part of circuits included in an internal circuit according to a related art of the present invention.

FIG. 19 is a diagram showing a part of circuits included in the internal circuit 33. As shown in FIG. 19, the internal circuit 33 includes a P-channel MOS transistor 34 and an N-channel MOS transistor 35 connected in series between the internal voltages VPM and VSS. A control signal S1 of which voltage changes between VSS and VPP is supplied to a gate of the transistor 34. A control signal S2 of which voltage changes within a predetermined voltage range is supplied to a gate of the transistor 35. A node P between the transistors 34 and 35 is connected to the main-word line MWL, for example. During the standby time, this circuit works to fix the voltage of the main-word line MWL to VPM, by turning on the transistor 34 and turning off the transistor 35 by controlling the voltage of each control signal.

Figure 20A:
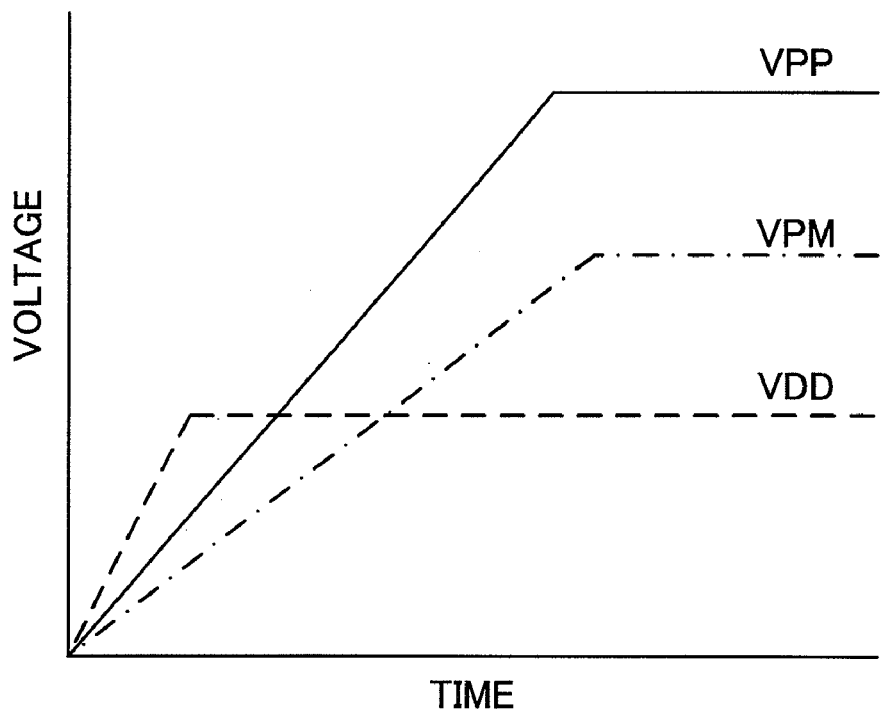
FIG. 20A shows an ideal relationship between time and voltage.
Figure 20B:
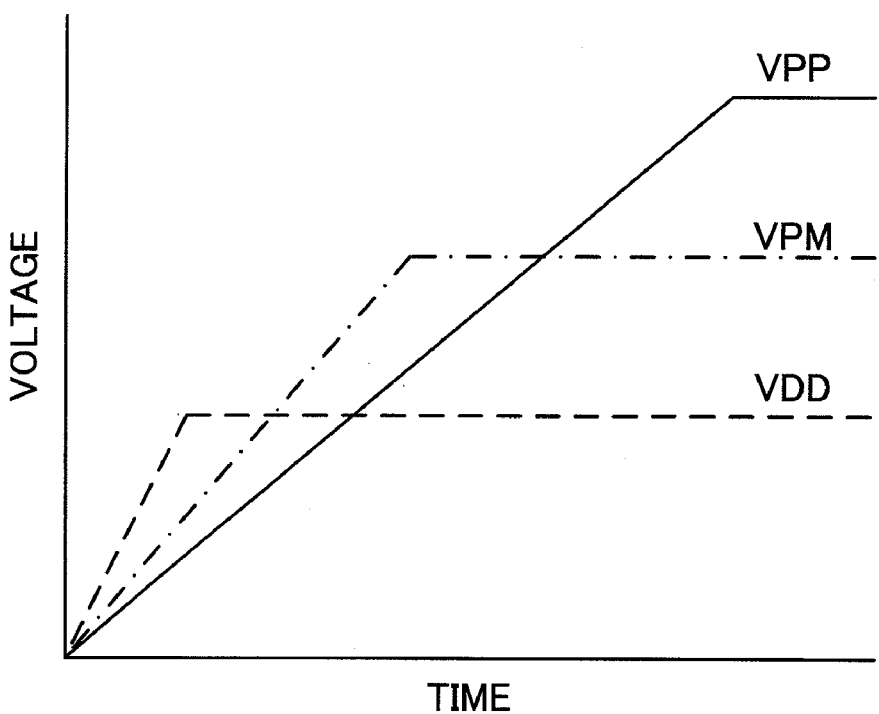
FIG. 20B shows an ideal relationship between time and voltage according to a related art of the present invention.

Ideally, VPP and VPM are generated to satisfy a relationship of VPP>VPM both at the time of turning on the power source and in the steady state. FIG. 20A shows an ideal relationship between time and voltage of VDD, VPP, and VPM at the time of turning on the power source. As shown in FIG. 20A, ideally, VPM is always lower than VPP. However, in the semiconductor device 30, the internal-voltage generating circuits 31 and 32 independently generate internal voltages, and the relationship is temporarily reversed to VPP<VPM at the time of turning on the power source. FIG. 20B shows this state. As shown in FIG. 20B, when VPM temporarily becomes higher than VPP, the transistor 34 cannot be turned off during this period, and the transistor 34 is fixed to the on state. Therefore, when the transistor 35 is configured to be turned on at the time of turning on the power source, a through current flows from VPM to VSS. As explained above, when VPP and VPM are reversed, a through current is often generated.

The semiconductor device 400 is further explained with referring back to FIG. 6. A threshold voltage of the transistor 121 is set higher than the power supply voltage VDD, like in the semiconductor device 100. The transistor 121 is not turned on unless the output of the voltage generating unit 111 supplied to the gate via the switch 131 becomes equal to or higher than this threshold voltage. Therefore, the timing when the voltage generating unit 112 starts generating the internal voltage VPM is delayed from the timing when the voltage generating unit 111 starts generating the internal voltage VPP.

FIGS. 8A to 8C show a state of the delay. FIG. 8A shows a result of measuring a relationship between time and a voltage of VDD at the time of turning on the power source. FIG. 8B shows a result of measuring a relationship between time and voltages of VPP and VPM at the time of turning on the power source in the semiconductor device 30 according to the related art. Meanwhile, FIG. 8C shows a result of measuring a relationship between time and voltages of VPP and VPM at the time of turning on the power source in the semiconductor device 400 according to the fourth embodiment.

As shown in FIGS. 8A and 8B, in the semiconductor device 30, when the power supply voltage VDD starts increasing and reaches a certain value, the internal-voltage generating circuits 31 and 32 simultaneously start generating the internal voltages. As a result, the internal voltage VPM rises before the internal voltage VPP, and a period of VPM>VPP is generated. The internal voltage VPM rises earlier due to a fast increase because of a lower voltage than the internal voltage VPP, and because the internal voltage VPM generally has a smaller load capacitance than the internal voltage VPP.

On the other hand, as shown in FIGS. 8A and 8C, in the semiconductor device 400, when the power supply voltage VDD starts increasing and reaches a certain value, the voltage generating unit 111 first starts generating the internal voltage. In this case, the output of the voltage generating unit 112 also increases mildly because of the above-described off current. When the output of the voltage generating unit 111 exceeds the threshold voltage of the transistor 121, the transistor 121 is turned on to supply the power supply voltage VDD to the voltage generating unit 112. As a result, the voltage generating unit 112 starts generating the internal voltage. Because the voltage generating unit 112 generates the internal voltage at a delayed timing in this way, the semiconductor device 400 does not generate a period of VPM>VPP, as is clear from FIG. 8C.

As explained above, according to the fourth embodiment, because the power consumption of the voltage generating unit 112 during the standby time becomes substantially zero, wasteful power consumption generated by the internal-voltage generating circuit 110 can be reduced. Further, it is possible to avoid the reversal of the voltage relationship to VPM>VPP at the time of turning on the power source.

A fifth embodiment of the present invention is explained next.

Figure 9:
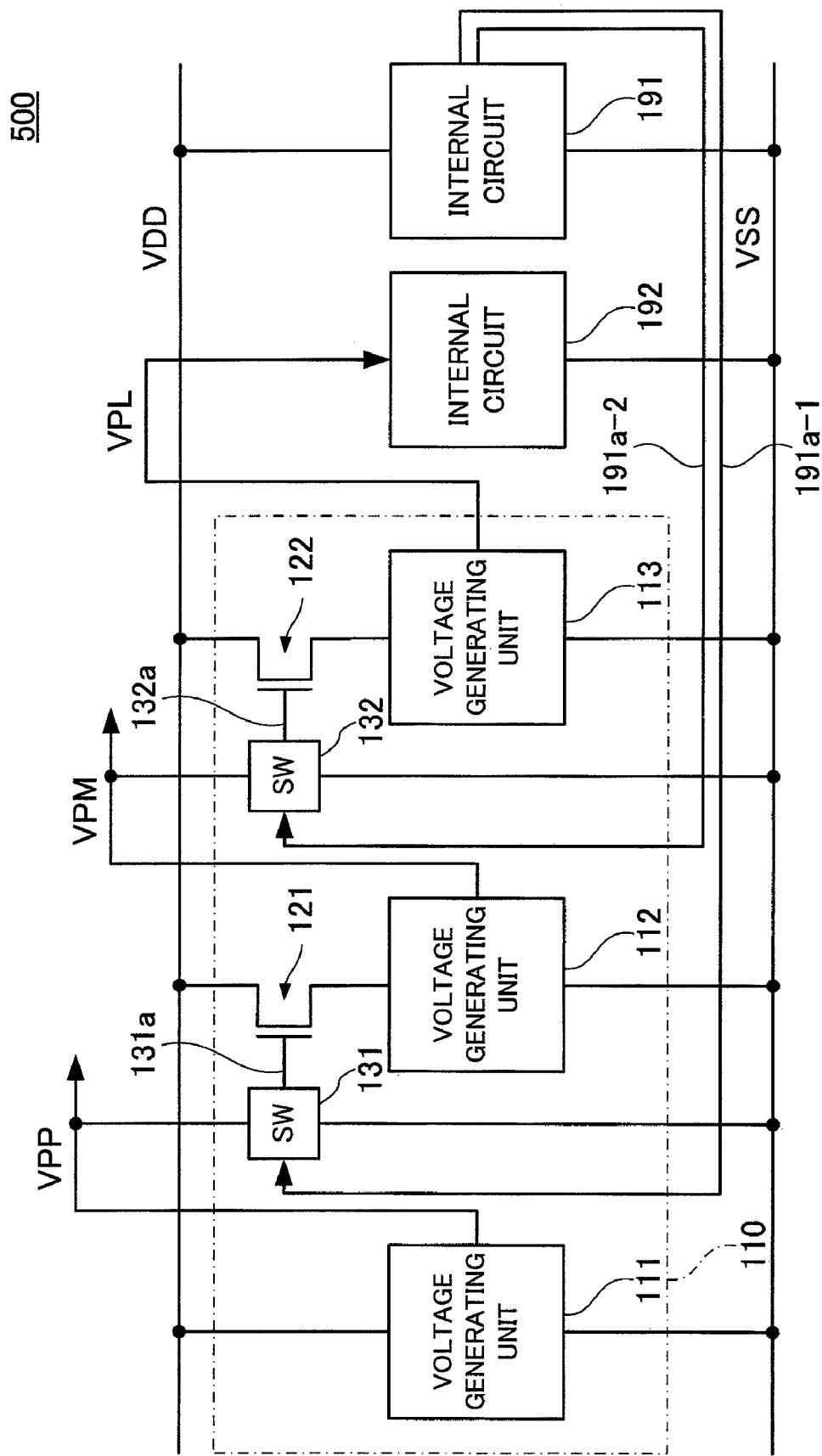
FIG. 9 is a block diagram showing a semiconductor device according to a fifth embodiment of the present invention.

FIG. 9 is a block diagram showing a semiconductor device 500 according to the fifth embodiment.

As shown in FIG. 9, in the semiconductor device 500, the voltage generating unit 111 generates the internal voltage VPP, and the voltage generating unit 112 generates the internal voltage VPM. The semiconductor device 500 further includes a voltage generating unit 113 generating the internal voltage VPL, the N-channel MOS transistor 122, and a switch 132. The internal circuit 192 is operated at the internal voltage VPL. Although not shown, the semiconductor device 500 can also include other internal circuit operated at the internal voltage VPP and the internal voltage VPM. The internal voltage VPP and the internal voltage VPM can be also supplied to the internal circuit 192. The power supply voltage VDD and the internal voltages VPP, VPM, and VPL in principle satisfy a relationship of VPP>VPM>VPL>VDD. Other configurations of the semiconductor device 500 are similar to those of the semiconductor device 100 shown in FIG. 1, and therefore identical elements are denoted by like reference numerals and redundant explanations thereof will be omitted.

In the fifth embodiment, the internal circuit 191 generates a standby signal 191a-1 and a standby signal 191a-2. The standby signal 191a-1 becomes at the standby level when at least an internal circuit (not shown) operated at the internal voltage VPM becomes in the standby state, and becomes at the active level when the internal circuit becomes in the active state. On the other hand, the standby signal 191a-2 becomes at the standby level when at least the internal circuit 192 becomes in the standby state, and becomes at the active level when at least the internal circuit 192 becomes in the active state. Both the standby signal 191a-1 and the standby signal 191a-2 are supplied to the internal-voltage generating circuit 110.

As shown in FIG. 9, the three voltage generating units 111, 112, and 113 are connected in cascade in this order. The voltage generating circuits 111, 112, and 113 are circuit blocks operated at the power supply voltage VDD.

The power supply voltage VDD is directly supplied to the voltage generating unit 111 located at the higher position. The power supply voltage VDD is not directly supplied to the voltage generating unit 112 located at the second position, but is supplied to the voltage generating unit 112 via the transistor 121. The detail of this is as explained above for the semiconductor device 100.

On the other hand, the power supply voltage VDD is not directly supplied to the voltage generating unit 113 located at the lowest position, but is supplied to the voltage generating unit 113 via the transistor 122. That is, the transistor 122 is connected between the power source wiring to which the higher potential of the power supply voltage VDD is supplied and the voltage generating unit 113. When the transistor 122 is turned on, the power supply voltage VDD is supplied to the voltage generating unit 113 to activate the voltage generating unit 113. As a result, the voltage generating unit 113 generates the internal voltage VPL. On the other hand, when the transistor 122 is turned off, the power supply voltage VDD is not supplied to the voltage generating unit 113. Accordingly, the voltage generating unit 113 becomes in an inactive state, and stops generating the internal voltage VPL.

A control signal 132a as an output of the switch 132 is supplied to a gate of the transistor 122. The switch 132 is a circuit operated at the internal voltage VPM generated by the voltage generating unit 112. When the standby signal 191a-2 is at the active level, the switch 132 sets the control signal 132a to an VPM level, and when the standby signal 191a-2 is at the standby level, the switch 132 sets the control signal 132a to the ground level. As a result, a gate voltage of the transistor 122 changes between the ground level and the VPM level.

As explained above, the switch 132 operated at the internal voltage VPM controls the voltage generating unit 113. Therefore, the voltage generating unit 113 located at the lowest position is not activated when the voltage generating unit 112 located at the higher position does not generate the internal voltage VPM. As a result, the voltage generating unit 113 is activated by the output of the voltage generating unit 112.

As described above, the internal voltage VPM is higher than the power supply voltage VDD. Therefore, a threshold voltage of the N-channel transistor 122 can be set to exceed the power supply voltage VDD, like that in the transistor 121. This means that when the transistor 122 is off, the off current $I_{OFF}$ is very small. That is, when the internal circuit 192 is in the standby state, and when the supply of the internal voltage VPL becomes unnecessary, power consumption of the voltage generating unit 113 becomes substantially zero. Accordingly, wasteful power consumption can be reduced.

In the semiconductor device 500, when the power supply voltage VDD starts increasing to become a certain value, first the voltage generating unit 111 starts generating the internal voltage. When the output of the voltage generating unit 111 exceeds the threshold voltage of the transistor 121, the transistor 121 is turned on to supply the power supply voltage VDD to the voltage generating unit 112. Accordingly, the voltage generating unit 112 starts generating the internal voltage.

Further, when the output of the voltage generating unit 112 exceeds the threshold voltage of the transistor 122, the transistor 122 is turned on to supply the power supply voltage VDD to the voltage generating unit 113. Accordingly, the voltage generating unit 113 starts generating the internal voltage.

As explained above, the starting timings of generating the internal voltages by the voltage generating units 111, 112, and 113 sequentially arrive in this order. As a result, the semiconductor device 500 generates neither a period of VPM>VPP nor a period of VPL>VPM.

As explained above, according to the fifth embodiment, power consumption of the voltage generating units 112 and 113 during the standby time can be set to substantially zero. Therefore, wasteful power consumption generated by the internal-voltage generating circuit 110 can be reduced. Further, the relationships of VPM>VPP and VPL>VPM at the time of turning on the power source can be prevented.

In the fifth embodiment, either the voltage generating unit 112 or the voltage generating unit 113 can be a circuit generating the internal voltage VPP instead of the internal voltage VPM or the internal voltage VPL. In this case, outputs of the plural voltage generating units generating the internal voltage VPP can be short-circuited.

Figure 10:
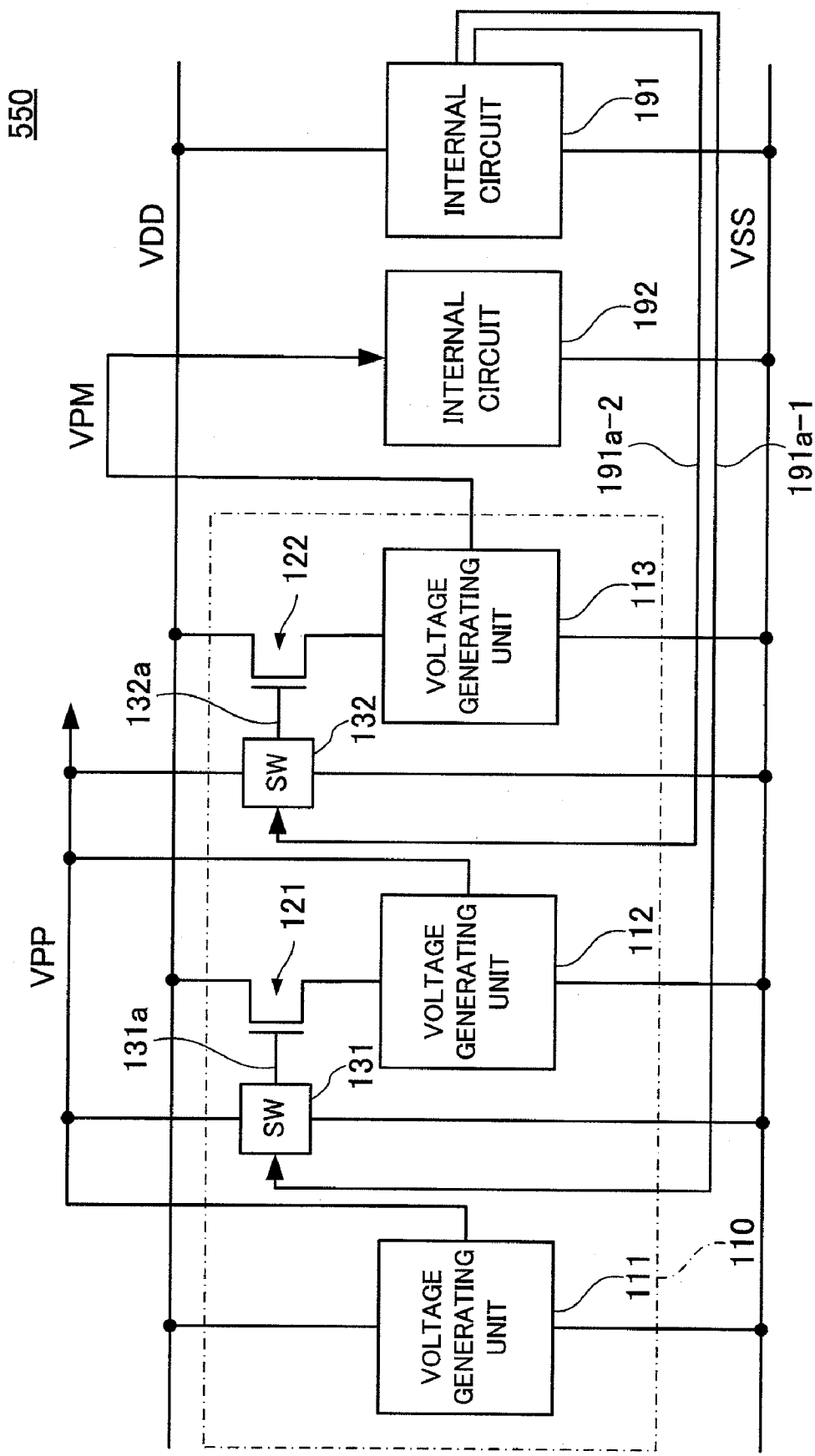
FIG. 10 is a block diagram showing a semiconductor device according to a modification of the fifth embodiment of the present invention.

FIG. 10 is a block diagram showing a semiconductor device 550 according to a modification of the fifth embodiment.

As shown in FIG. 10, in the semiconductor device 550, the voltage generating unit 111 and the voltage generating unit 112 generate the internal voltage VPP, and the voltage generating unit 113 generates the internal voltage VPM. The output of the voltage generating unit 111 and the output of the voltage generating unit 112 are short-circuited, and the internal circuit 192 is operated at the internal voltage VPM. Although not shown, the semiconductor device 550 can also include other internal circuit operated at the internal voltage VPP, or the internal voltage VPP can be supplied to the internal circuit 192. Other configurations of the semiconductor device 550 are similar to those of the semiconductor device 500 shown in FIG. 9, and therefore identical elements are denoted by like reference numerals and redundant explanations thereof will be omitted.

As shown in FIG. 10, in the modification, the voltage generating unit 112 and the voltage generating unit 113 are arranged in parallel to be connected in cascade at a lower level of the voltage generating unit 111.

The internal circuit 191 generates the standby signal 191a-1 and the standby signal 191a-2. The standby signal 191a-1 becomes at the standby level when at least an internal circuit (not shown) operated at the internal voltage VPP becomes in the standby state. The standby signal 191a-1 becomes at the active level when this internal circuit becomes in the active state. On the other hand, the standby signal 191a-2 becomes at the standby level when at least the internal circuit 192 becomes in the standby state. The standby signal 191a-2 becomes at the active level when at least the internal circuit 192 becomes in the active state. Both the standby signal 191a-1 and the standby signal 191a-2 are supplied to the internal-voltage generating circuit 110.

Both the switch 131 and the switch 132 are circuits operated at the internal voltage VPP generated by the voltage generating unit 111. The switch 131 sets the control signal 131a to the VPP level when the standby signal 191a-1 is at the active level, and sets the control signal 131a to the ground level when the standby signal 191a-1 is at the standby level. Similarly, the switch 132 sets the control signal 132a to the VPP level when the standby signal 191a-2 is at the active level, and sets the control signal 132a to the ground level when the standby signal 191a-2 is at the standby level. With this arrangement, gate voltages of the transistor 121 and the transistor 122 change between the ground level and the VPP level.

As explained above, both the voltage generating unit 112 and the voltage generating unit 113 are controlled by the switches operated at the internal voltage VPP. Therefore, both the voltage generating unit 112 and the voltage generating unit 113 are activated when the voltage generating unit 111 located at the higher position generates the internal voltage VPP.

Therefore, according to the modification, because power consumptions of the voltage generating units 112 and 113 during the standby time become substantially at the zero level, wasteful power consumption generated in the internal-voltage generating circuit 110 can be reduced. Further, the voltage generating unit 112 and the voltage generating unit 113 can simultaneously start generating the internal voltage. Consequently, as compared with the configuration of arranging three voltage generating units in series, a time lag until when the internal power source rises at the time of turning on the power source can be decreased.

A sixth embodiment of the present invention is explained next.

Figure 11:
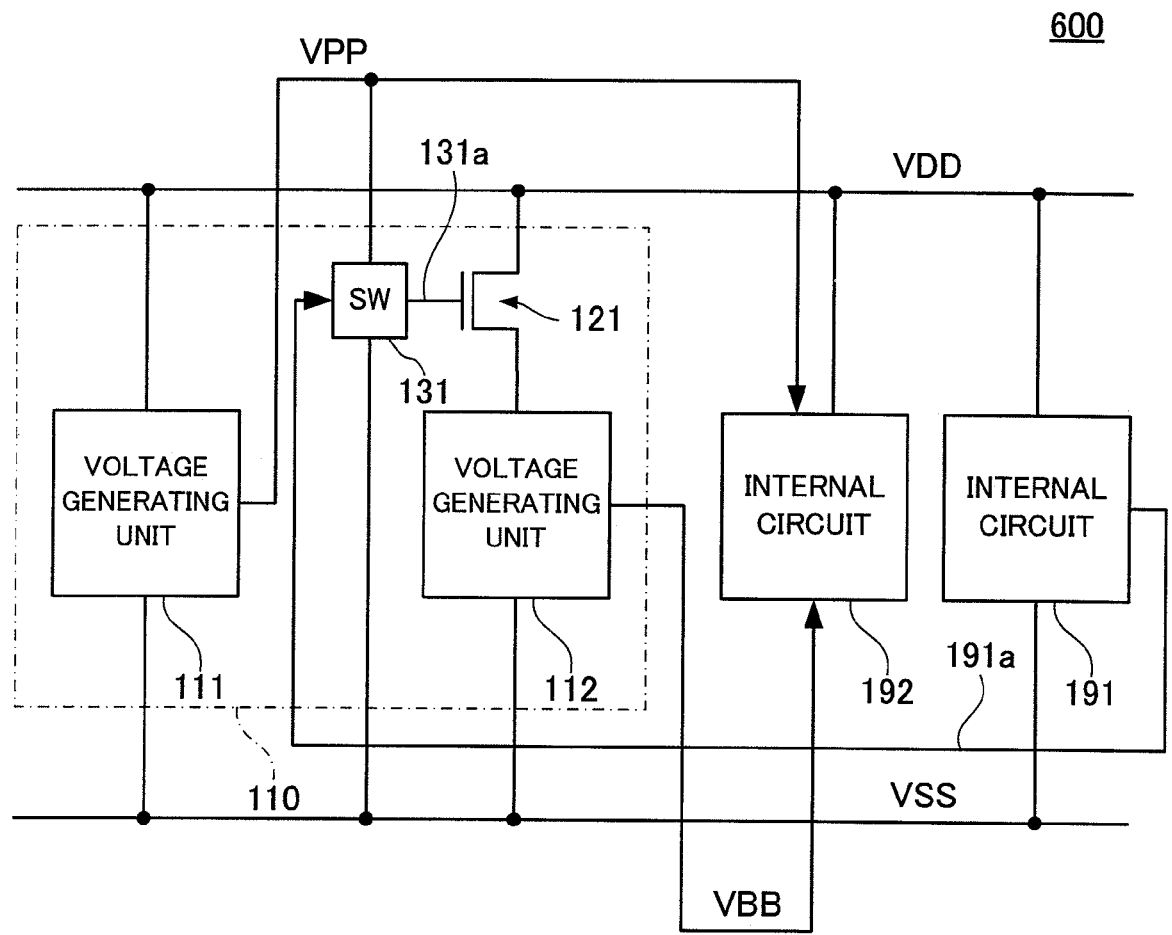
FIG. 11 is a block diagram showing a semiconductor device according to a sixth embodiment of the present invention.

FIG. 11 is a block diagram showing a semiconductor device 600 according to the sixth embodiment.

As shown in FIG. 11, in the semiconductor device 600, the voltage generating unit 112 generates an internal voltage VBB. The internal circuit 192 is operated at the power supply voltage VDD, the internal voltage VPP, and the internal voltage VBB. The internal voltage VBB has a voltage (a negative voltage) lower than the voltage VSS. Other configurations of the semiconductor device 600 are similar to those of the semiconductor device 400 shown in FIG. 6, and therefore identical elements are denoted by like reference numerals and redundant explanations thereof will be omitted.

Figure 12:
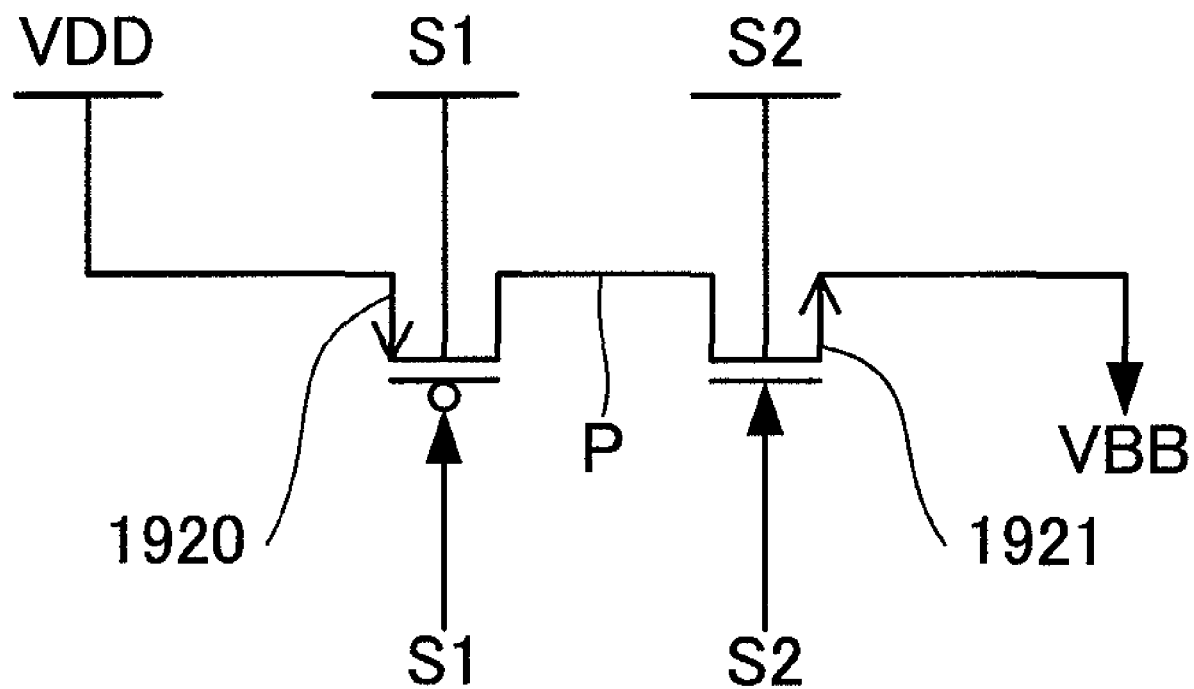
FIG. 12 shows a part of circuits included in the internal circuit according to the sixth embodiment of the present invention.

FIG. 12 shows a part of circuits included in the internal circuit 192. As shown in FIG. 12, the internal circuit 192 is configured to include a circuit having a series connection of a P-channel MOS transistor 1920 and an N-channel MOS transistor 1921 between the power sources VDD and VBB. The control signal S1 changing between VSS and VPP is supplied to a gate of the transistor 1920. The control signal S2 changing within a predetermined voltage range is supplied to a gate of the transistor 1921.

Figure 8:
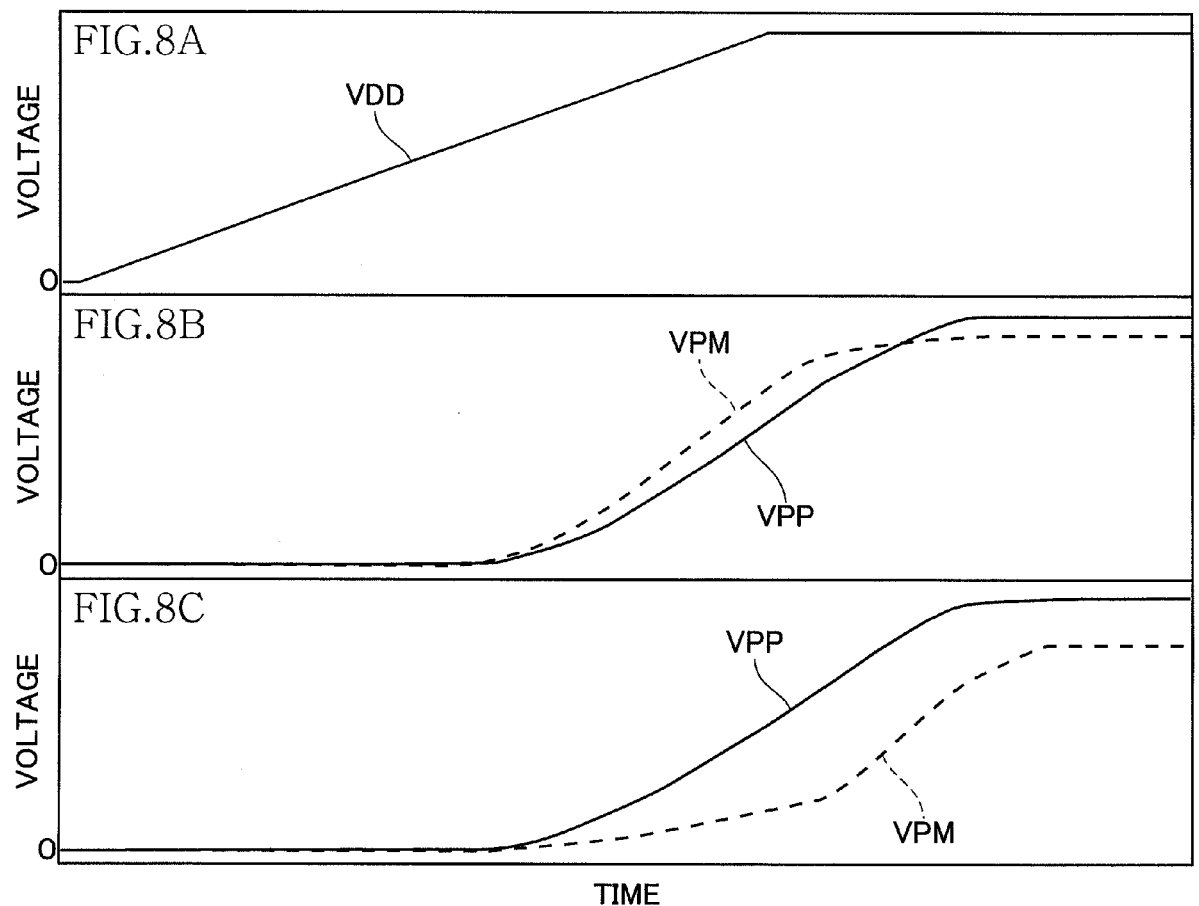
FIG. 8A-C shows a result of measuring a relationship between time and a voltage about the power supply voltage and the internal voltage according to the fourth embodiment of the present invention.

VDD and VPP are in the relationship of VPP>VDD in the steady state. However, as shown in FIG. 8, a period of VDD>VPP occurs at the time of turning on the power source. During this period, the transistor 1920 cannot be turned off, and the transistor 1920 is fixed to the on state. Therefore, when the internal circuit is configured to have a logic of turning on the transistor 1921 at the time of turning on the power source, and also when the internal voltage VBB is generated first, a through current flows from VDD to VBB. In this way, a through current is generated when VDD and VPP are reversed.

In the semiconductor device 600, the voltage generating unit 112 starts generating the internal voltage later than the voltage generating unit 111, based on a system similar to that of the semiconductor device 400. During the period of VDD>VPP at the time of turning on the power source, the voltage generating unit 112 does not yet start generating the internal voltage VBB. Therefore, even when both transistors 1920 and 1921 are temporarily turned on at the time of turning on the power source, a generated through current becomes very small.

As explained above, according to the sixth embodiment, the power consumption of the voltage generating unit 112 during the standby time becomes substantially zero. Therefore, wasteful power consumption generated in the internal-voltage generating circuit 110 can be reduced. Further, a current flowing through the internal circuit 192 at the time of turning on the power source can be lowered.

A seventh embodiment of the present invention is explained next.

Figure 13:
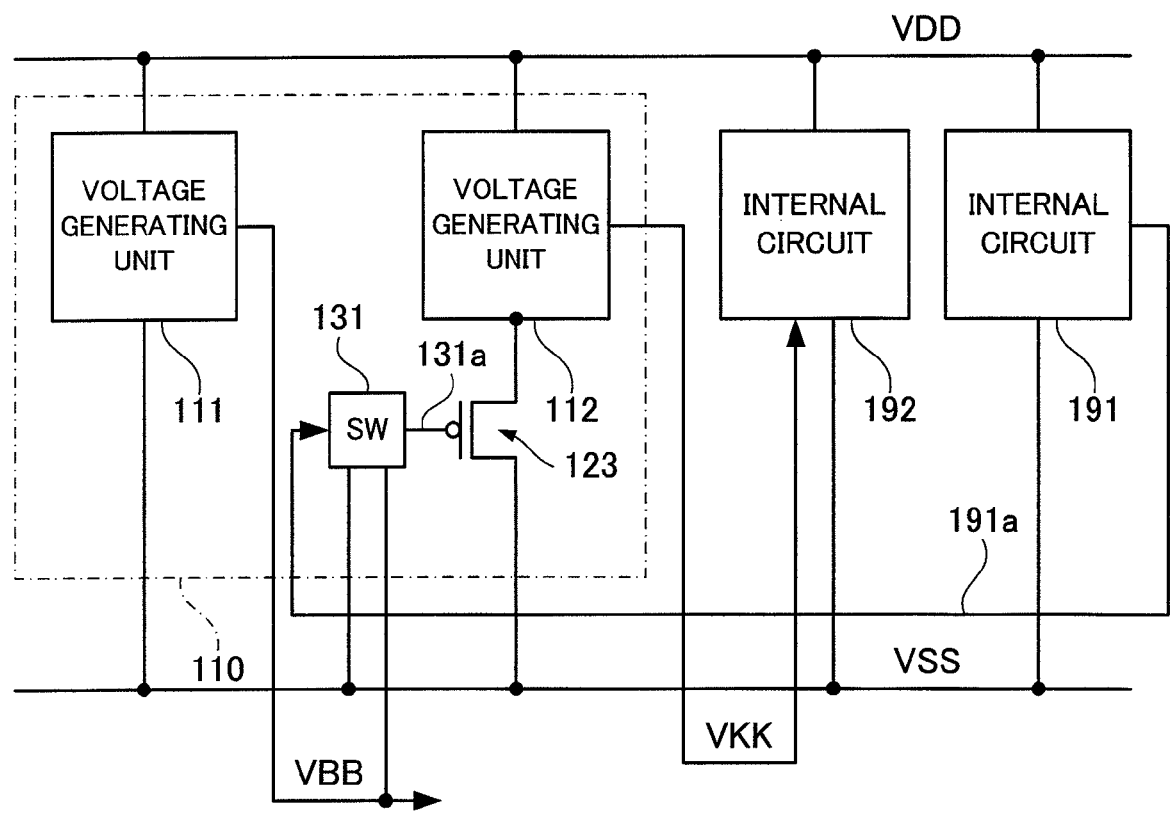
FIG. 13 is a block diagram showing a semiconductor device according to a seventh embodiment of the present invention.

FIG. 13 is a block diagram showing a semiconductor device 700 according to the seventh embodiment.

As shown in FIG. 13, in the semiconductor device 700, the voltage generating unit 111 generates the internal voltage VBB, and the voltage generating unit 112 generates the internal voltage VKK. The semiconductor device 700 has a P-channel MOS transistor 123 connected between a power source wiring to which the lower potential VSS of the power supply voltage is supplied and the voltage generating unit 112. The control signal 131a as the output of the switch 131 is supplied to the gate of the transistor 123. The internal voltage VKK generated by the voltage generating unit 112 is supplied to the internal circuit 192. The internal voltage VBB generated by the voltage generating unit 111 is supplied to an internal circuit (not shown). The internal voltage VBB can be supplied to the internal circuits 191 and 192.

Both the internal voltage VBB and the internal voltage VKK are minus voltages, and the internal voltage VBB is lower than the internal voltage VKK. Other configurations of the semiconductor device 700 are similar to those of the semiconductor device 400 shown in FIG. 6, and therefore identical elements are denoted by like reference numerals and redundant explanations thereof will be omitted.

Figure 14A:
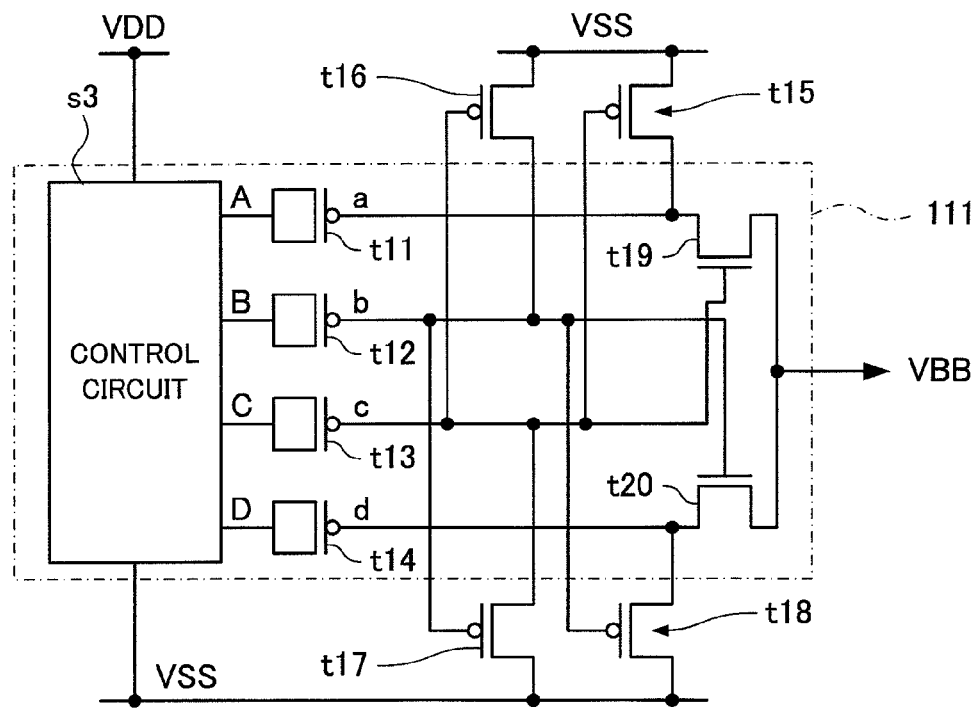
FIG. 14A shows an example of a detailed circuit configuration of the voltage generating unit 111 generating the internal voltage VBB according to the seventh embodiment of the present invention.
Figure 14B:
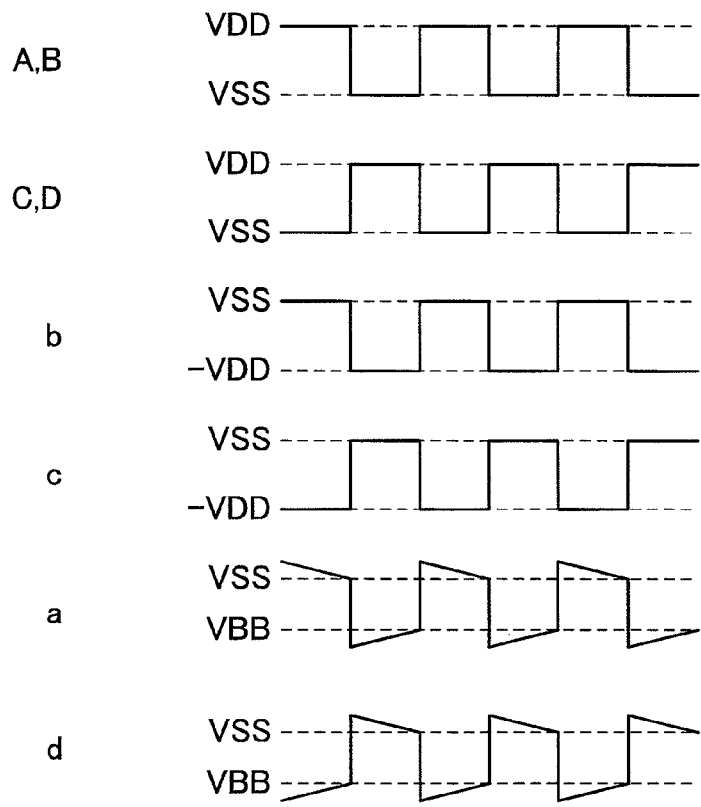
FIG. 14B is an operation waveform diagram of the voltage generating unit.

FIG. 14A shows an example of a detailed circuit configuration of the voltage generating unit 111 generating the internal voltage VBB, and FIG. 14B is an operation waveform diagram of the voltage generating unit 111.

The voltage generating unit 111 shown in FIG. 14A generates the minus internal voltage VBB, and includes P-channel MOS transistors t11 to t18, N-channel MOS transistors t19 and t20, and a control circuit s3 controlling the operation of these transistors.

A source and a drain of each of the transistors t11, t12, t13, and t14 are short-circuited, and each of these transistors functions as a capacitor. Each source (drain) of these transistors is connected to the control circuit s3. The control circuit s3 supplies control voltages A, B, C, and D to these transistors.

The transistors t15, t16, t17, and t18 are connected to between each gate of the transistors t11, t12, t13, and t14 and the lower voltage VSS of the power supply voltage, respectively. The gates of the transistors t15 and t16 are connected to the gate of the transistor t13, and the gates of the transistors t17 and t18 are connected to the gate of the transistor t12. Further, the gate of the transistor t11 is connected to the output terminal of the voltage generating unit 111 via the transistor t19. The gate of the transistor t19 is connected to the gate of the transistor t13. Similarly, the gate of the transistor t14 is connected to the output terminal of the voltage generating unit 111 via the transistor t20. The gate of the transistor t20 is connected to the gate of the transistor t12.

As shown in FIG. 14B, the voltage generating unit 111 having the above configuration generates the internal voltage VBB as the output, by alternately performing a charge operation and a pumping operation to the transistor t11 and the transistor t14.

A charge operation of the transistor t11 and a pumping operation of the transistor t14 are performed by setting the control voltages A, B, C, and D to VDD, VDD, VSS, and VSS, respectively. As a result, the transistors t15, t16, and t20 are turned on, and the transistors t17, t18, and t19 are turned off. A charging to the transistor t11 is started, and a voltage at a node a is charged to VSS as shown in FIG. 14B. On the other hand, a discharging of the transistor t18 is started, and a voltage at a node d becomes an internal voltage VBB=2VSS−

VDD as shown in FIG. 14B. This internal voltage VBB appears at the output terminal of the voltage generating unit 111.

A pumping operation of the transistor t11 and a charge operation of the transistor t14 are performed by setting the control voltages A, B, C, and D to VSS, VSS, VDD, and VDD, respectively. As a result, the transistors t15, t16, and t20 are turned off, and the transistors t17, t18, and t19 are turned on. A discharging of the transistor t11 is started, and a voltage at the node a becomes the internal voltage VBB=2VSS−VDD as shown in FIG. 14B. This internal voltage VBB appears at the output terminal of the voltage generating unit 111. On the other hand, a charging to the transistor t14 is started, and a voltage at the node d is charged to VSS as shown in FIG. 14B.

The circuits shown in FIG. 14A shows only one example of the voltage generating unit 111, and can have circuit configurations different from the configurations of these circuits. The voltage generating unit 112 generating the internal voltage VKK can also have a circuit configuration similar to it shown in FIG. 14A.

Figure 15A:
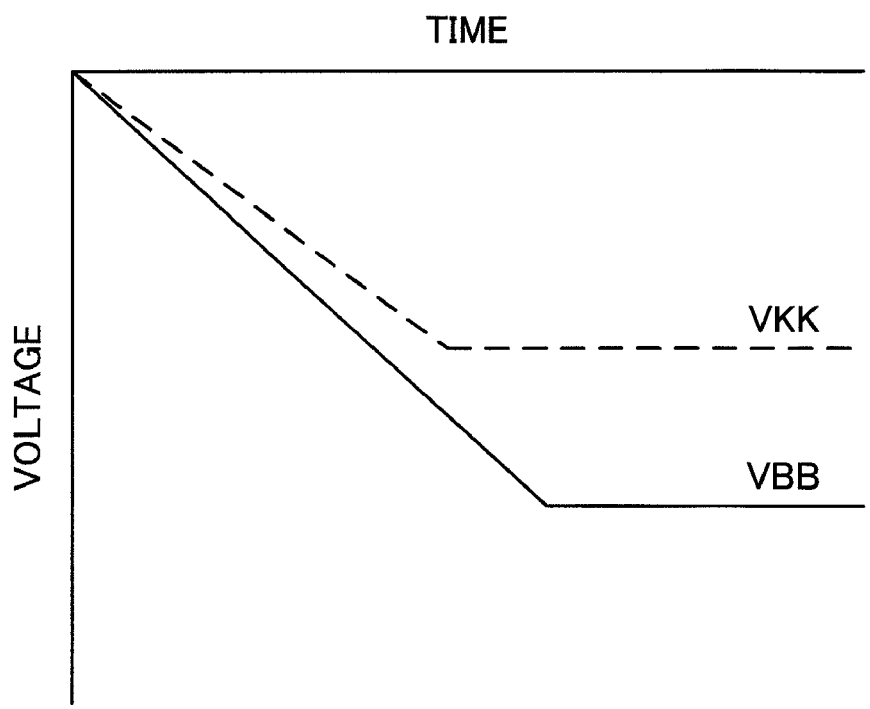
FIG. 15A shows an ideal relationship between time and voltage.
Figure 15B:
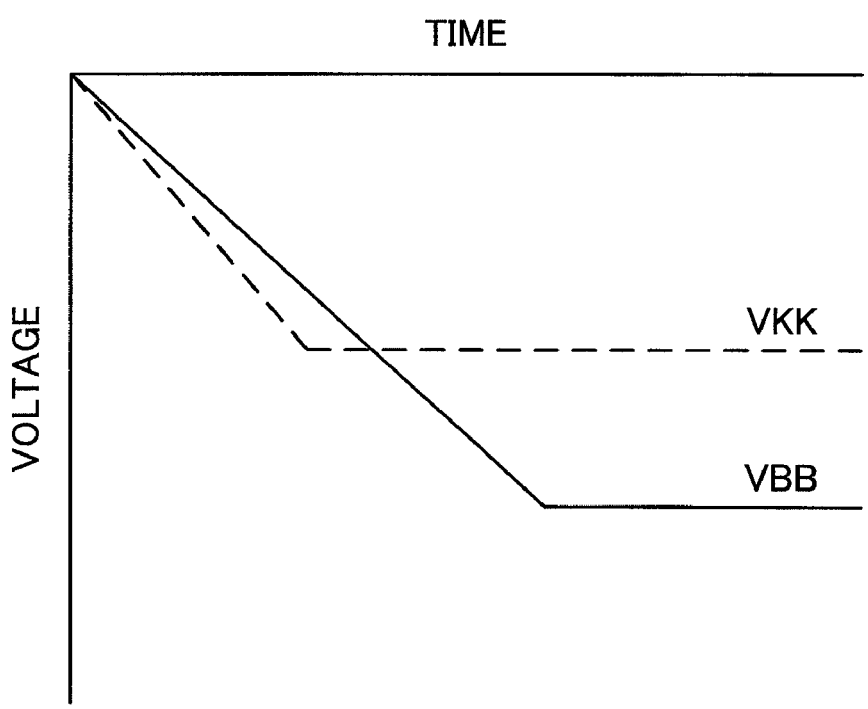
FIG. 15B shows an ideal relationship between time and voltage according to a related art of the present invention.
Figure 16:
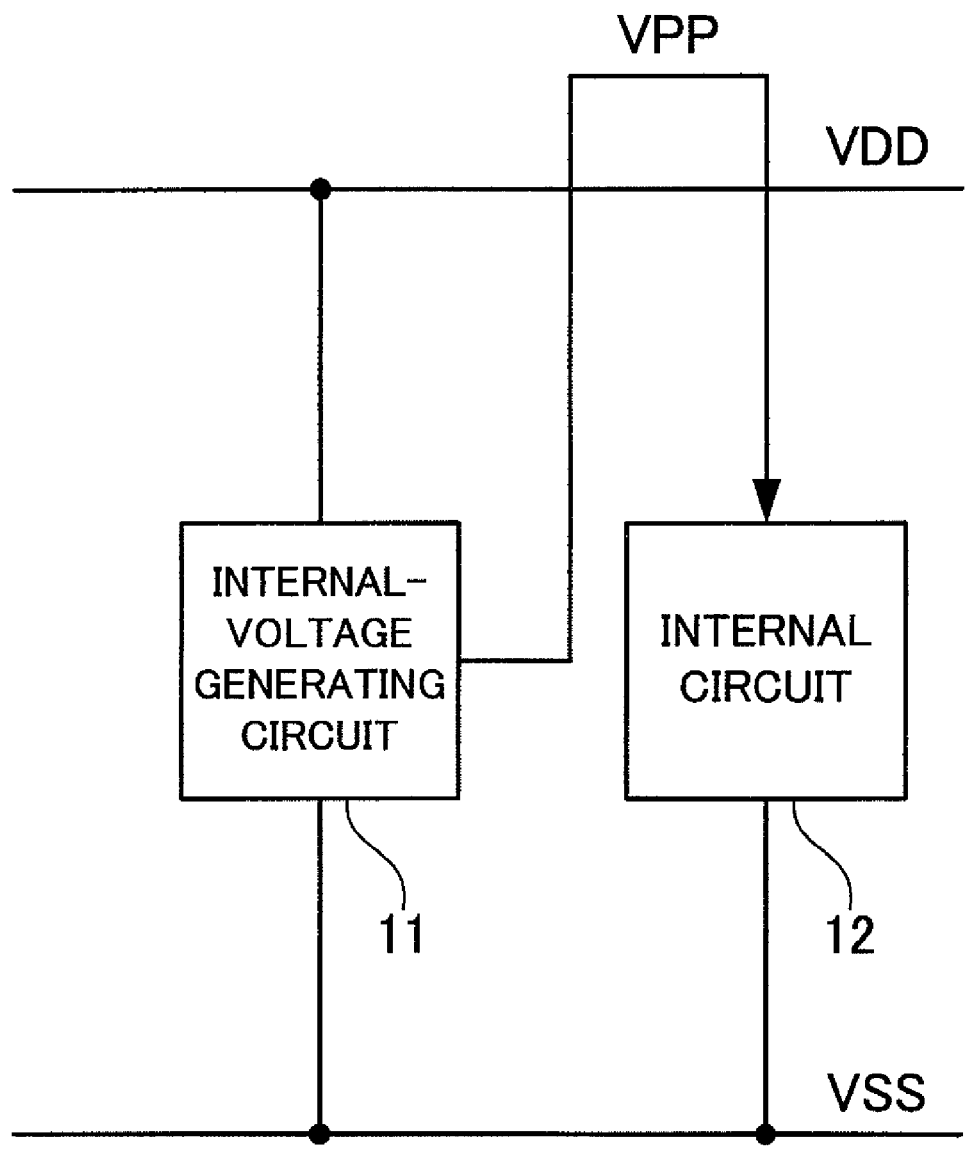
FIG. 16 is a block circuit showing a semiconductor device according to a related art of the present invention.
Figure 17:
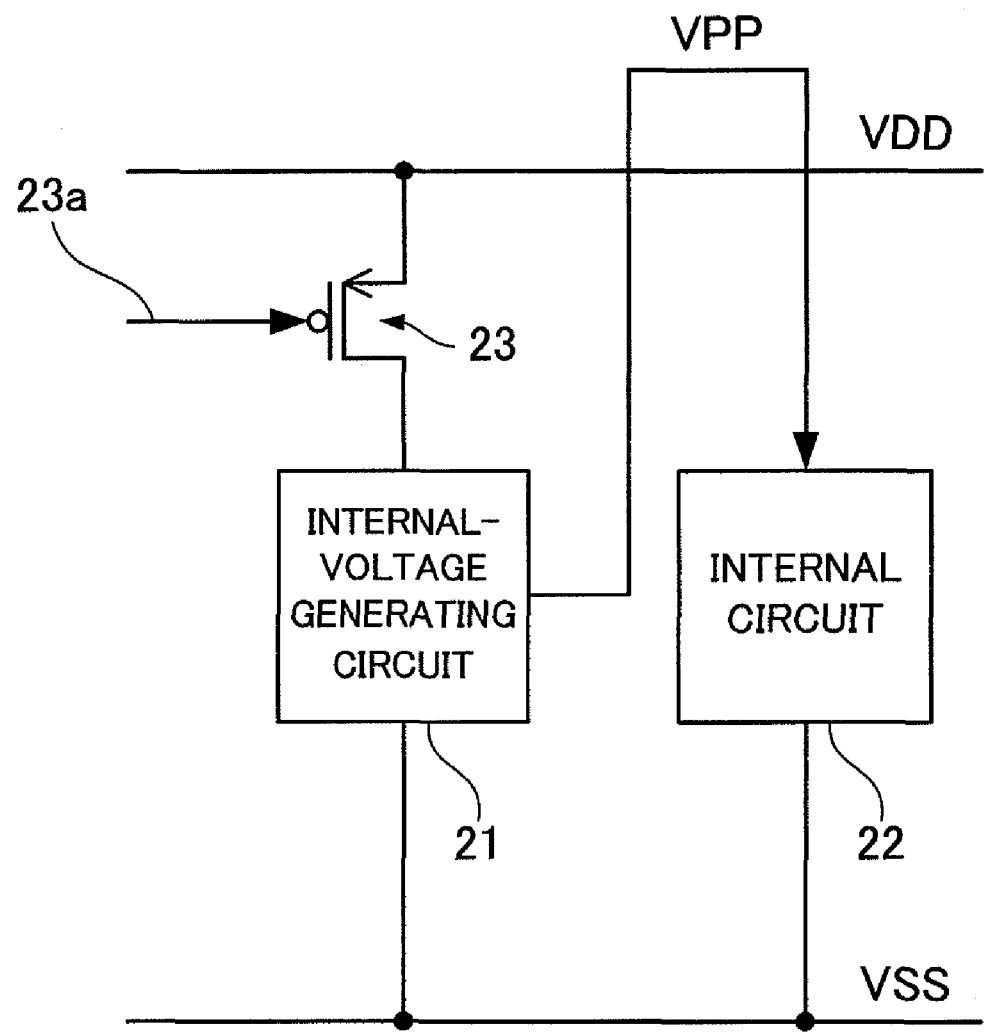
FIG. 17 is a block circuit showing a semiconductor device according to a related art of the present invention.

Ideally, VBB and VKK are generated to satisfy a relationship of VKK>VBB both at the time of turning on the power source and in the steady state. FIG. 15A shows an ideal relationship between time and voltages of VKK and VBB at the time of turning on the power source. As shown in FIG. 15A, ideally, VBB is always lower than VKK. On the other hand, according to the related art, VBB and VKK temporarily have a relationship of VKK<VBB at the time of turning on the power source, like the relationship between VPP and VPM as explained with reference to FIG. 18 and FIGS. 20A and 20B. FIG. 15B shows this state. The semiconductor device 700 can also maintain the state shown in FIG. 15A at the time of turning on the power source, that is, the relationship of VKK>VBB.

In the semiconductor device 700 shown in FIG. 13, when the power supply voltage VDD starts increasing to reach a certain value, the voltage generating unit 111 first starts generating the internal voltage. When a difference between the power supply voltage VDD and the output voltage of the voltage generating unit 111 exceeds a threshold voltage of the transistor 123, the transistor 123 is turned on to start the power supply voltage VDD to the voltage generating unit 112. As a result, the voltage generating unit 112 starts generating the internal voltage. Because the voltage generating unit 112 starts generating the internal voltage at a delayed timing, the semiconductor device 700 does not generate a period of VKK>VBB.

As explained above, according to the seventh embodiment, because the power consumption of the voltage generating unit 112 during the standby time becomes substantially zero, wasteful power consumption generated in the internal-voltage generating circuit 110 can be reduced. Further, the relationship of VKK>VBB at the time of turning on the power source can be prevented.

It is apparent that the present invention is not limited to the above embodiments, but may be modified and changed without departing from the scope and spirit of the invention.

For example, the transistor 121 or 122 of the semiconductor devices 100, 200, 300, 400, 500, and 600 can be respectively replaced with the P-channel MOS transistor, and this P-channel MOS transistor can be connected between the power source wiring to which the lower potential VSS of the power supply voltage is supplied and the voltage generating unit, like the transistor 123 of the semiconductor device 700. Conversely, the transistor 123 of the semiconductor device 700 can be replaced with the N-channel MOS transistor, and this N-channel MOS transistor can be connected between the power source wiring to which the higher potential VDD of the power supply voltage is supplied and the voltage generating unit. With this arrangement, wasteful power consumption generated in the internal-voltage generating circuit 110 can be also reduced.

What is claimed is:

1. A semiconductor device having an internal-voltage generating circuit, the internal-voltage generating circuit
    comprising a plurality of generating units connected in cascade,
    wherein out of the plurality of generating units, a generating unit of relatively lower level is activated by an output of a generating unit of relatively higher level, wherein the plurality of voltage generating units includes a first generating unit generating a first internal voltage, and a second generating unit generating a second internal voltage,
    the second generating unit is activated when a first transistor provided between a power source wiring to which one potential of a power supply voltage is supplied and the second generating unit turns on,
    the first transistor is controlled by the first internal voltage, and
    a threshold voltage of the first transistor exceeds the power supply voltage.

2. The semiconductor device as claimed in claim 1, wherein the power source wiring is supplied with a higher potential of the power supply voltage, and the first transistor is an N-channel MOS transistor.

3. The semiconductor device as claimed in claim 1, wherein the first generating unit is activated when a second transistor provided between the power source wiring and the first generating unit turns on, and
    a threshold voltage of the second transistor is equal to or lower than the power supply voltage.

4. The semiconductor device as claimed in claim 3, wherein the power source wiring is supplied with a higher potential of the power supply voltage, and the second transistor is a P-channel MOS transistor.

5. The semiconductor device as claimed in claim 1, wherein at least the second internal voltage has a higher potential higher than a higher potential of the power supply voltage, or has a lower potential lower than a lower potential of the power supply voltage.

6. The semiconductor device as claimed in claim 1, wherein the first internal voltage and the second internal voltage have same voltages, and an output of the first generating unit and an output of the second generating unit are short-circuited.

7. The semiconductor device as claimed in claim 6, wherein the first generating unit has a smaller driving capability than that of the second generating unit.

8. The semiconductor device as claimed in claim 1, wherein the second internal voltage is lower than the first internal voltage.

9. The semiconductor device as claimed in claim 8, wherein the plurality of voltage generating units further include a third generating unit activated by the first internal voltage and generating the first internal voltage,
    an output of the first generating unit and an output of the third generating unit are short circuited, and
    the first generating unit has a smaller driving capability than that of the third generating unit.

10. The semiconductor device as claimed in claim 1, further having a first internal circuit operated at the power supply voltage, and a second internal circuit operated at the first internal voltage.

11. The semiconductor device as claimed in claim 10, further having a plurality of word lines, a plurality of bit lines crossing the word lines, and a plurality of memory cells arranged at intersections of the word lines and the bit lines, wherein
the second internal circuit is a part of a word-line driving circuit activating the word lines.

12. A semiconductor device comprising:
a plurality of word lines;
a plurality of bit lines crossing the word lines;
a plurality of memory cells arranged at intersections of the word lines and the bit lines;
a word-line driving circuit activating the word lines;
an internal-voltage generating circuit including a first generating unit generating a first internal voltage, and a second generating unit generating a second internal voltage lower than the first internal voltage; and
a transistor connected between a power source wiring to which one potential of a power supply voltage is supplied and the second generating unit, the transistor being controlled by the first internal voltage, wherein
the word lines are hierarchised into main-word lines and sub-word lines,
the word-line driving circuit includes a main-word line driving circuit activating the main-word lines, and a sub-word line driving circuit activating the sub-word lines, and
the sub-word line driving circuit is supplied with at least the first internal voltage, and the main-word line driving circuit is supplied with at least the second internal voltage.

13. The semiconductor device as claimed in claim 12, wherein during a standby time, a level of an output signal that the main-word line driving circuit supplies to the sub-word line driving circuit is fixed to the second internal voltage.

14. A semiconductor device comprising:
a first power supply line supplied with a first power supply voltage;
a first voltage generator coupled to the first power supply line and generating, when activated, a first internal voltage in response to the first power supply voltage;
a transistor inserted between the first power supply line and the first voltage generator; and
a control unit coupled to supply a control voltage to a control electrode of the transistor, the control voltage taking one of an active voltage and an inactive voltage, the active voltage causing the first voltage generator to be activated, the inactive voltage causing the first voltage generator to be deactivated, and the active voltage of the control voltage being larger in absolute value than the first power supply voltage.

15. The device as claimed in claim 14, wherein the control unit includes a
second voltage generator and an output portion, the second voltage generator generates a second internal voltage which is larger in absolute value than the first power supply voltage, the output portion receives the second internal voltage and supplying the control electrode of the transistor with the second internal voltage as the active voltage of the control voltage.

16. The device as claimed in claim 15, further comprising a second power supply line supplied with a second power supply voltage, and wherein the first voltage generator is further coupled to the second power supply line and operates on the first and the second power supply voltages, and the inactive voltage of the control voltage is substantially equal to the second power supply voltage.

17. The device as claimed in claim 16, further comprising an internal circuit brought into one of an active state and an inactive stage, and wherein the control unit supplies the control voltage taking the active voltage to the control electrode of the transistor when the internal circuit is in the active state, and supplies the control voltage taking the inactive voltage to the control electrode of the transistor when the internal circuit is in the inactive state.

18. The device as claimed in claim 15, wherein the first internal voltage is substantially equal to the second internal voltage.

19. The device as claimed in claim 15, wherein the first internal voltage is lower than the second internal voltage and is higher than the first power supply voltage.

* * * * *